United States Patent
Twynam

(10) Patent No.: US 9,825,026 B2
(45) Date of Patent: Nov. 21, 2017

(54) SEMICONDUCTOR DEVICE AND SEMICONDUCTOR CIRCUIT INCLUDING THE SEMICONDUCTOR DEVICE WITH ENHANCED CURRENT-VOLTAGE CHARACTERISTICS

(71) Applicant: LG INNOTEK CO., LTD., Seoul (KR)

(72) Inventor: John Twynam, Seoul (KR)

(73) Assignee: LG INNOTEK., LTD., Seoul (KR)

( * ) Notice: Subject to any disclaimer, the term of this patent is extended or adjusted under 35 U.S.C. 154(b) by 0 days.

(21) Appl. No.: 15/100,028

(22) PCT Filed: Jan. 17, 2014

(86) PCT No.: PCT/KR2014/000518
§ 371 (c)(1),
(2) Date: May 27, 2016

(87) PCT Pub. No.: WO2015/083887
PCT Pub. Date: Jun. 11, 2015

(65) Prior Publication Data
US 2017/0005086 A1    Jan. 5, 2017

(30) Foreign Application Priority Data
Dec. 2, 2013   (KR) .................. 10-2013-0148330

(51) Int. Cl.
*H01L 29/778* (2006.01)
*H01L 29/20* (2006.01)
(Continued)

(52) U.S. Cl.
CPC ...... *H01L 27/0629* (2013.01); *H01L 27/0605* (2013.01); *H01L 27/085* (2013.01);
(Continued)

(58) Field of Classification Search
CPC .................................. H01L 27/0605
See application file for complete search history.

(56) References Cited

U.S. PATENT DOCUMENTS 7,786,511 B2 * 8/2010 Ishida ............... H01L 29/205
257/201
9,166,006 B1 * 10/2015 Rezanezhad Gatabi ............. H01L 29/2003
(Continued)

FOREIGN PATENT DOCUMENTS

WO    WO 2013/005372 A1    1/2013

OTHER PUBLICATIONS

Partial Supplementary European Search Report dated Oct. 31, 2016 issued in Application No. 14866875.9.
(Continued)

*Primary Examiner* — Eric Ward
(74) *Attorney, Agent, or Firm* — KED & Associates, LLP

(57) ABSTRACT

A semiconductor device is disclosed. The semiconductor device includes a substrate and a plurality of devices on the substrate, wherein a first device of the devices includes a first nitride semiconductor layer on the substrate, a second nitride semiconductor layer brought together with the first nitride semiconductor layer to form a first heterojunction interface, between the substrate and the first nitride semiconductor layer, a third nitride semiconductor layer brought together with the second nitride semiconductor layer to form a second heterojunction interface, between the substrate and the second nitride semiconductor layer, and a first contact electrically connected to the first and second heterojunction interfaces.

21 Claims, 12 Drawing Sheets

(51) Int. Cl.
  *H01L 27/06* (2006.01)
  *H01L 29/872* (2006.01)
  *H01L 27/085* (2006.01)
  *H01L 49/02* (2006.01)
  *H01L 29/205* (2006.01)
  *H01L 21/8252* (2006.01)

(52) U.S. Cl.
  CPC .............. *H01L 28/10* (2013.01); *H01L 28/40* (2013.01); *H01L 29/2003* (2013.01); *H01L 29/205* (2013.01); *H01L 29/7783* (2013.01); *H01L 29/7787* (2013.01); *H01L 29/872* (2013.01); *H01L 21/8252* (2013.01)

(56) References Cited

U.S. PATENT DOCUMENTS

| | | | |
|---|---|---|---|
| 9,536,873 B2* | 1/2017 | Kanechika | H01L 29/66462 |
| 9,680,001 B2* | 6/2017 | Shibata | H01L 29/7787 |
| 2002/0127787 A1 | 9/2002 | Huang et al. | |
| 2009/0206371 A1* | 8/2009 | Oka | H01L 29/4236 257/201 |
| 2009/0267078 A1 | 10/2009 | Mishra et al. | |
| 2010/0019279 A1 | 1/2010 | Chen et al. | |
| 2010/0140660 A1 | 6/2010 | Wu et al. | |
| 2011/0227132 A1 | 9/2011 | Yoshiharu et al. | |
| 2012/0267640 A1 | 10/2012 | Yifeng et al. | |
| 2013/0009165 A1* | 1/2013 | Park | H01L 21/8252 257/76 |
| 2013/0043484 A1* | 2/2013 | Curatola | H01L 29/205 257/76 |
| 2013/0074907 A1 | 3/2013 | Saunders | |
| 2013/0214287 A1 | 8/2013 | Naoya et al. | |
| 2013/0221409 A1* | 8/2013 | Nakajima | H01L 27/095 257/194 |
| 2013/0248931 A1 | 9/2013 | Saito et al. | |
| 2013/0299842 A1 | 11/2013 | Prechtl et al. | |
| 2014/0110759 A1* | 4/2014 | Murata | H01L 29/7783 257/194 |
| 2014/0138701 A1* | 5/2014 | Huang | H01L 29/7787 257/76 |
| 2015/0325689 A1* | 11/2015 | Takeya | H01L 29/66462 257/76 |

OTHER PUBLICATIONS

International Search Report dated Aug. 27, 2014 issued in Application No. PCT/KR2014/000518.

* cited by examiner

[Fig. 1]
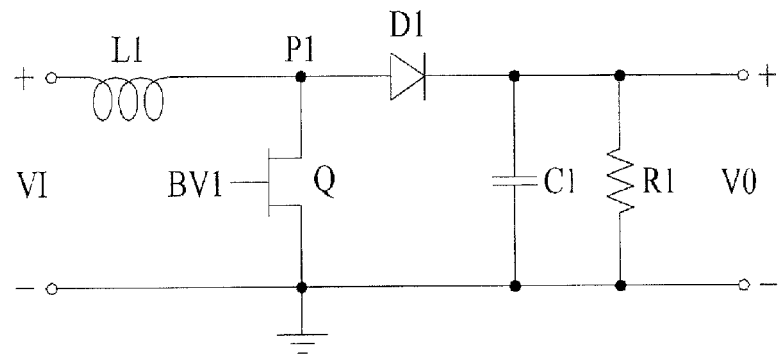
[Fig. 2]
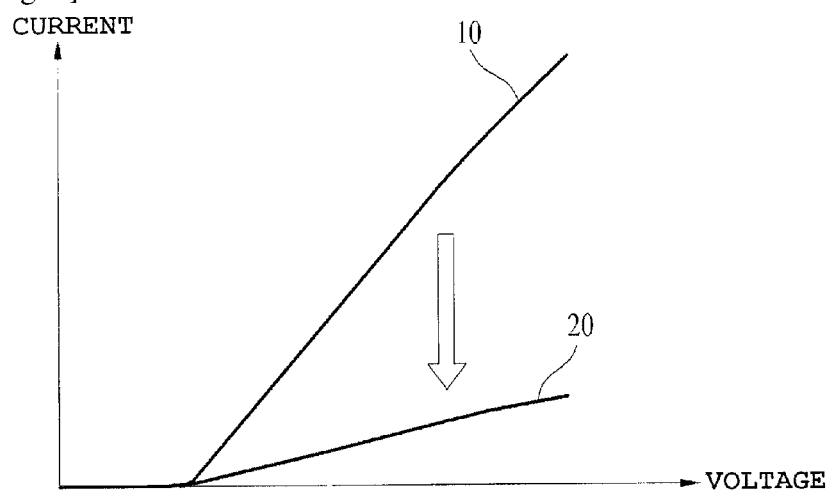
[Fig. 3]
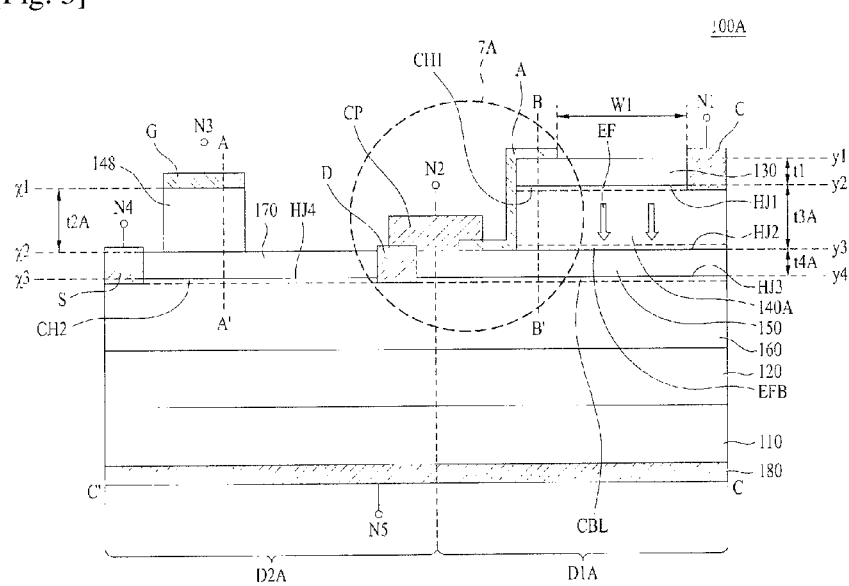

[Fig. 4]
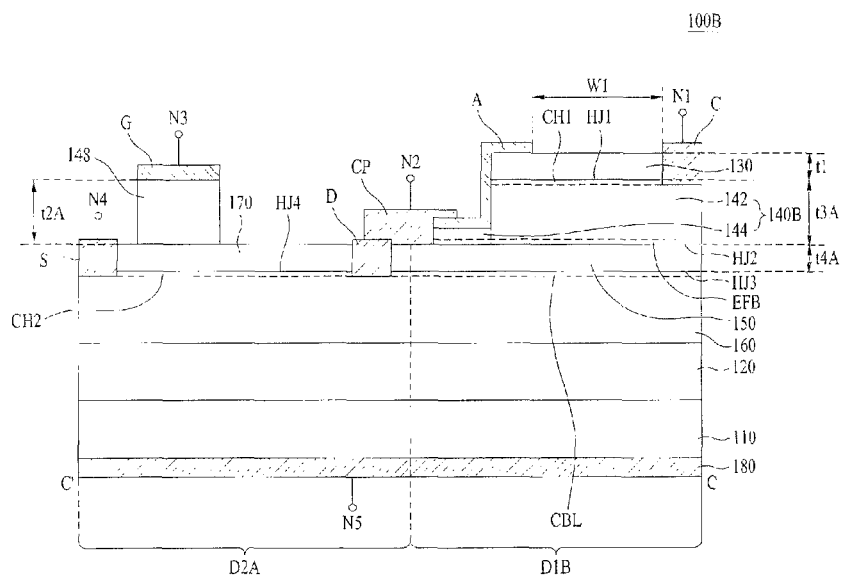
[Fig. 5]
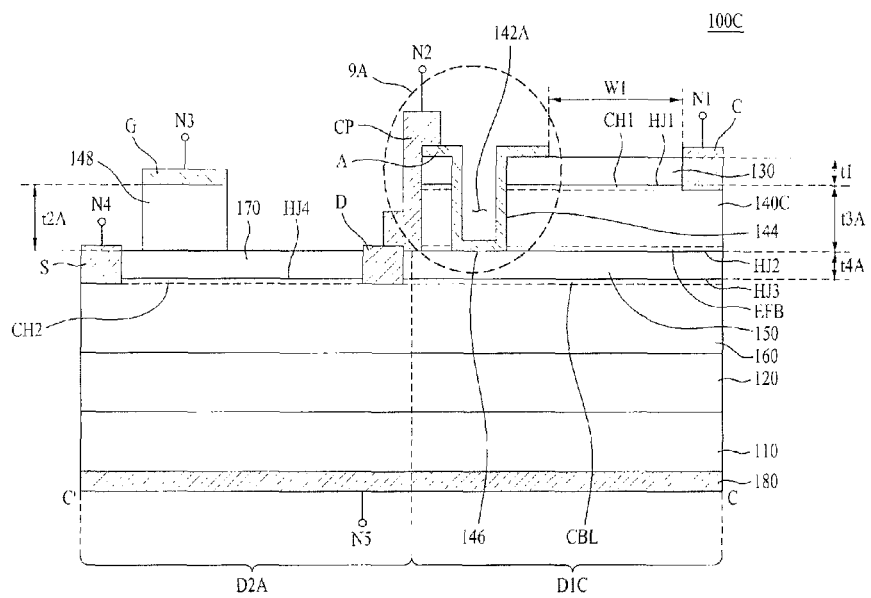

[Fig. 6]
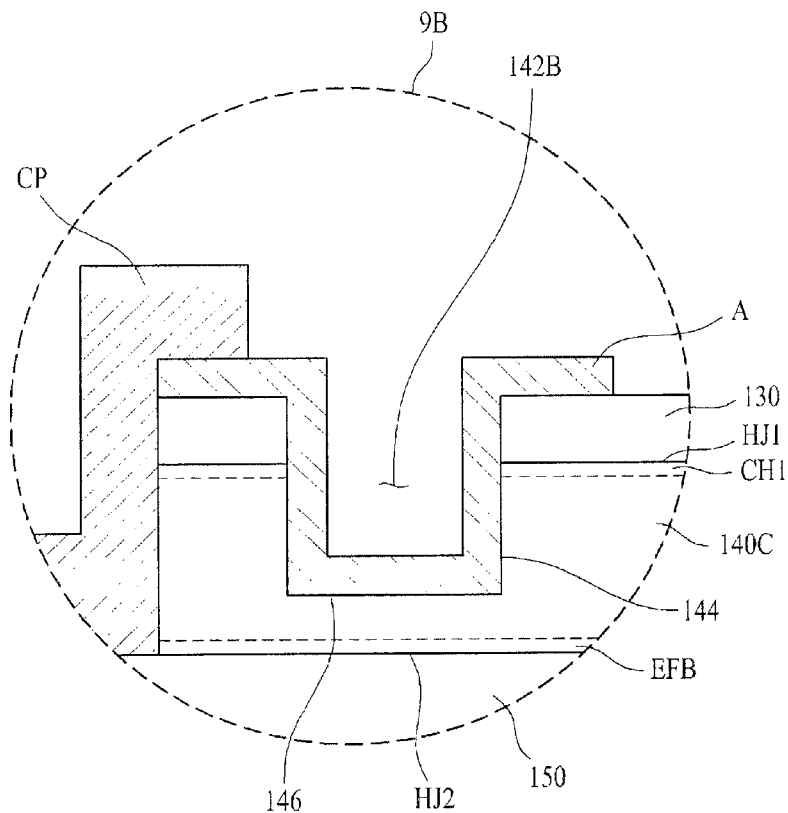
[Fig. 7]
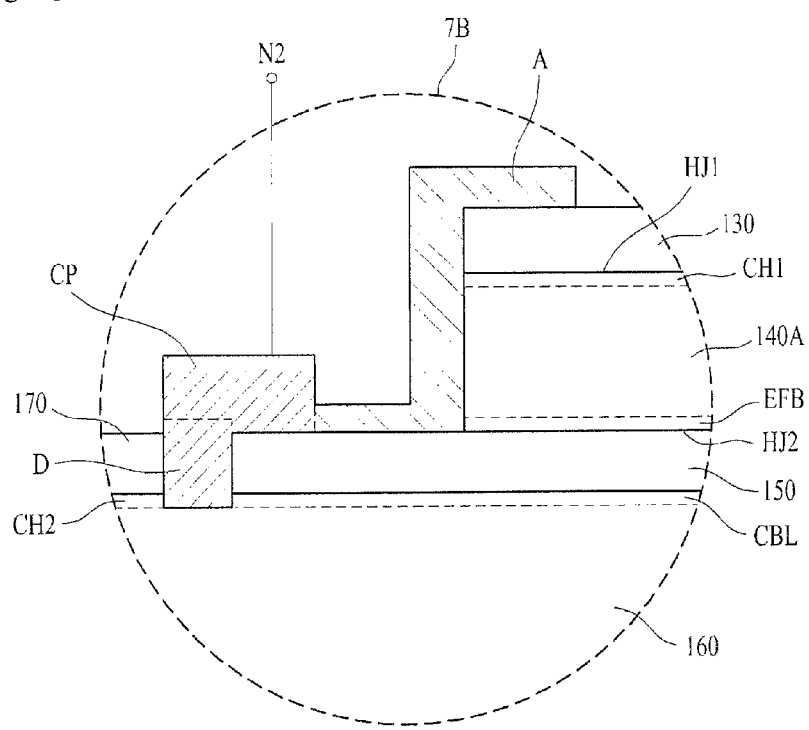

[Fig. 8]
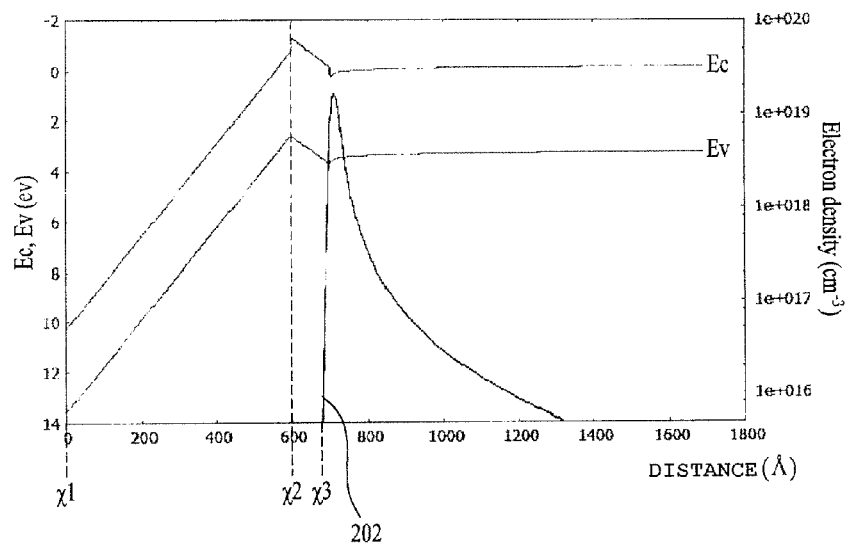
[Fig. 9]
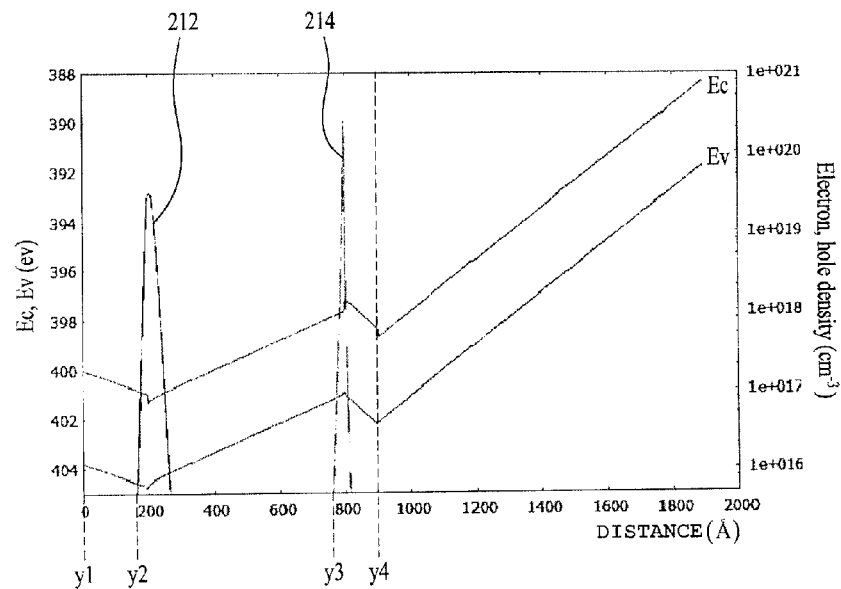

[Fig. 10]
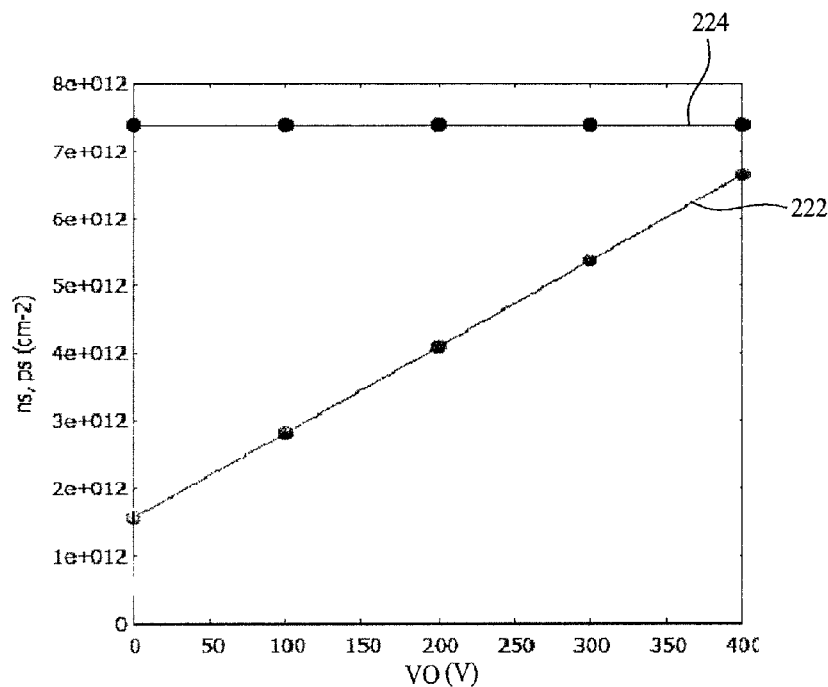
[Fig. 11]
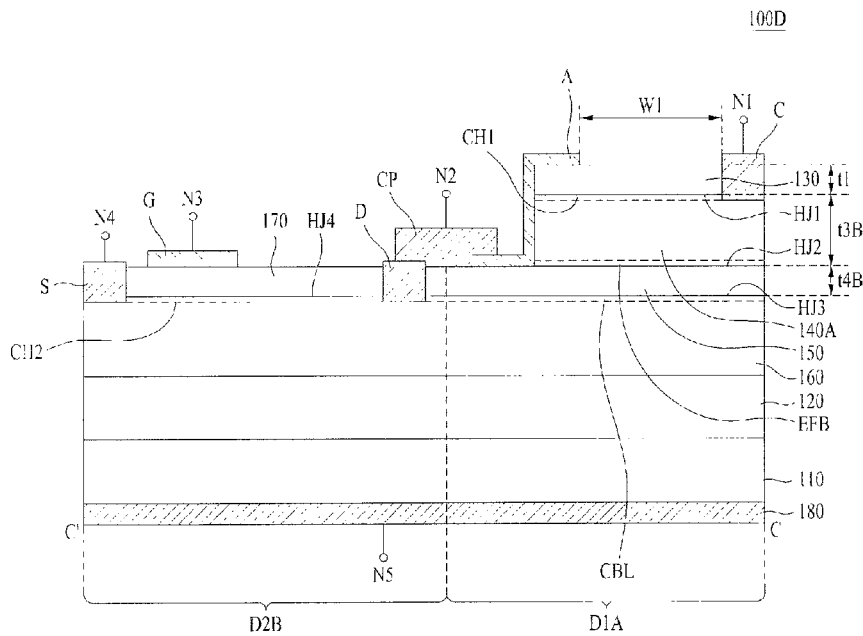

[Fig. 12]
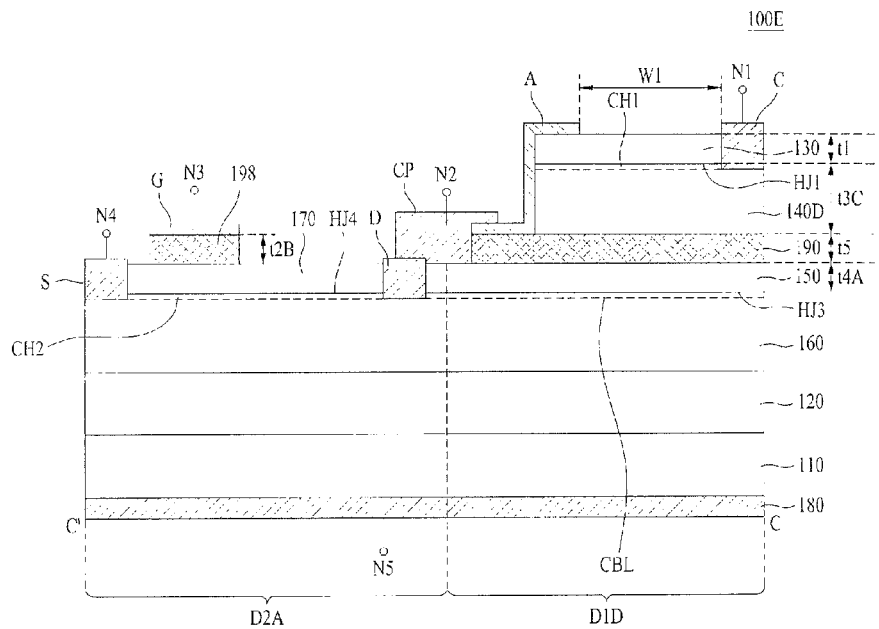
[Fig. 13]
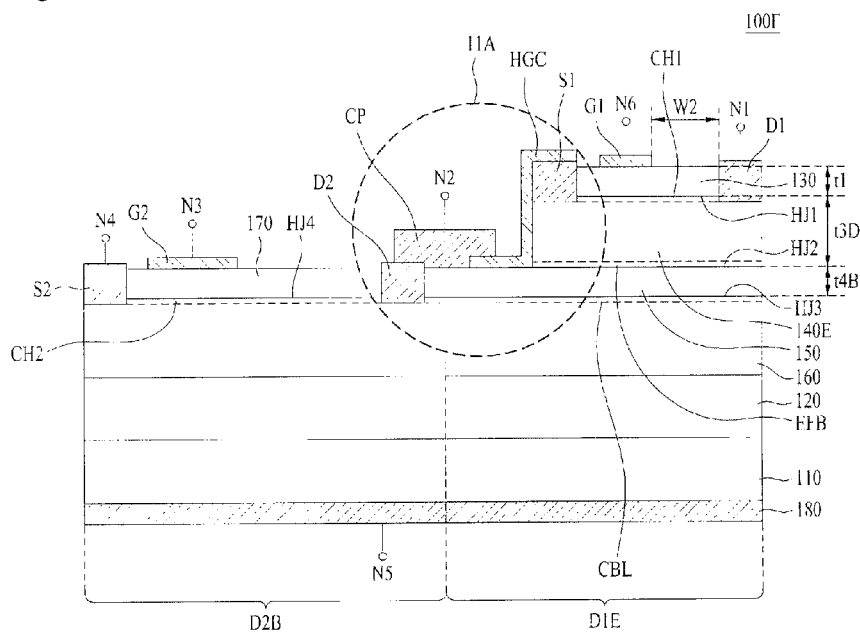

[Fig. 14]
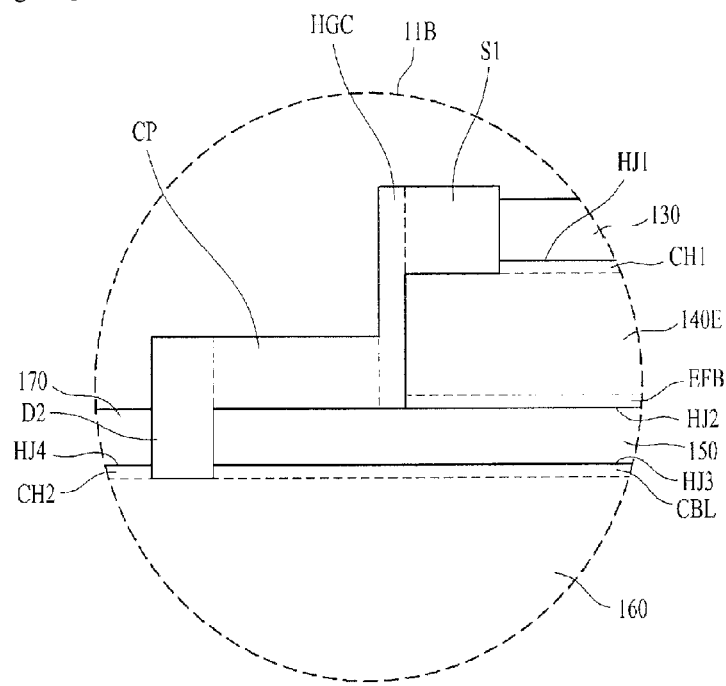
[Fig. 15]
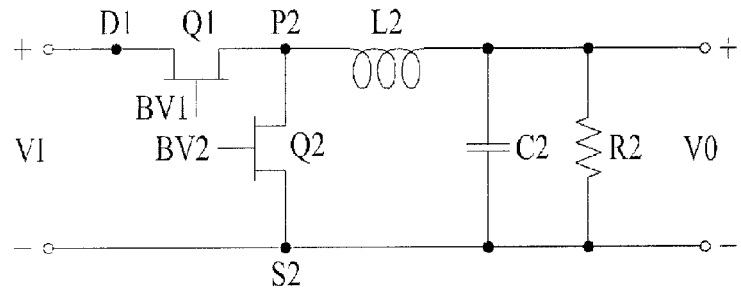
[Fig. 16]
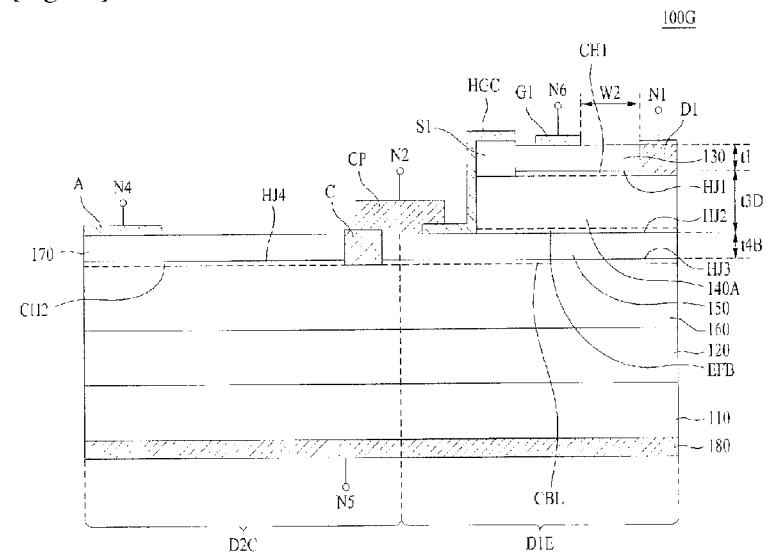

[Fig. 17]
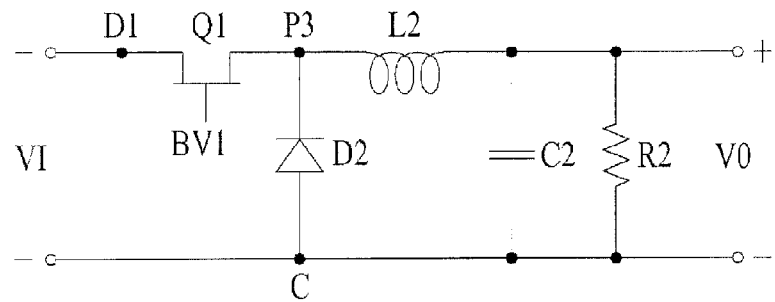
[Fig. 18]
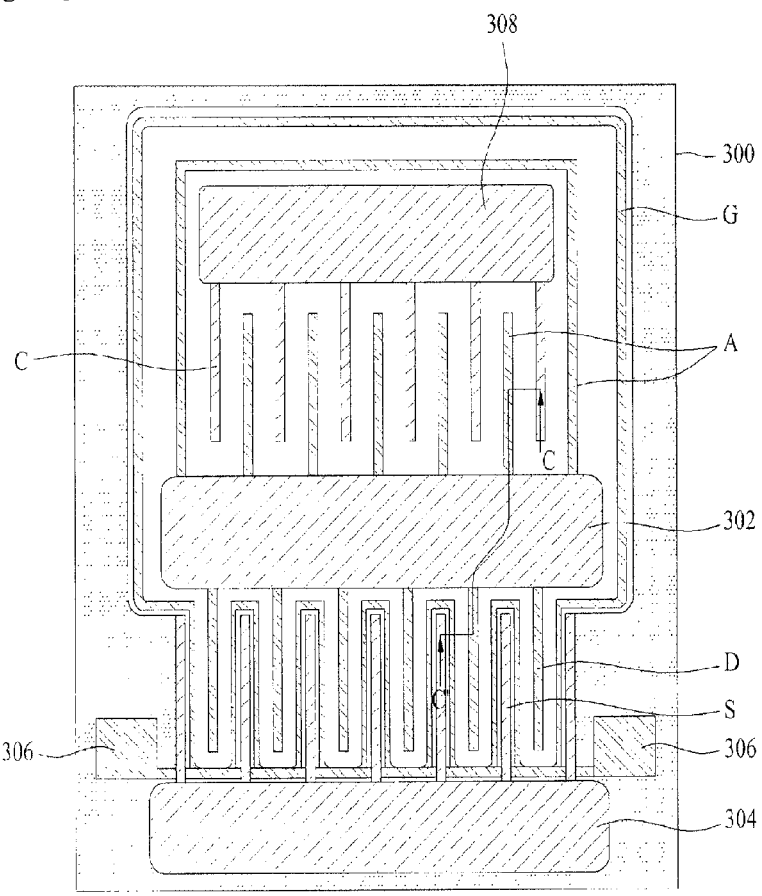
[Fig. 19a]
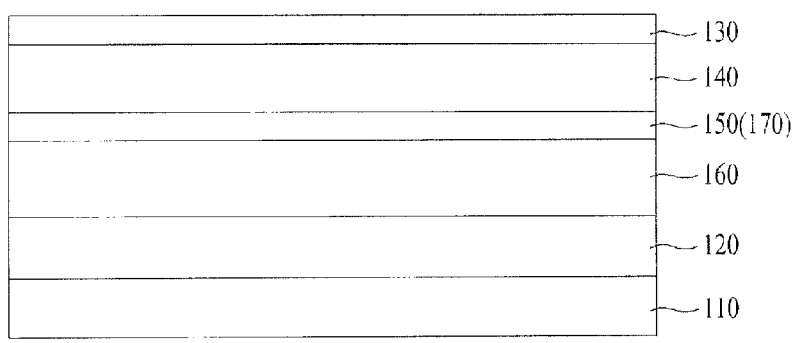

[Fig. 19b]
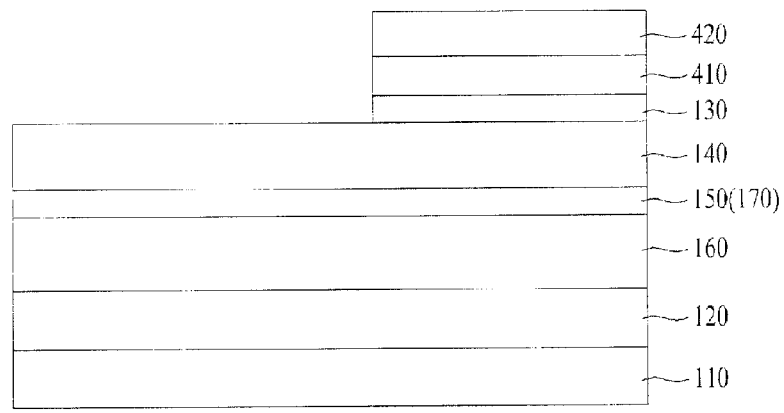
[Fig. 19c]
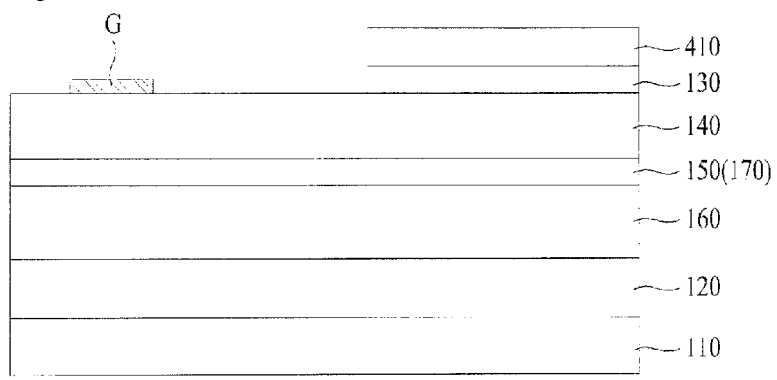
[Fig. 19d]
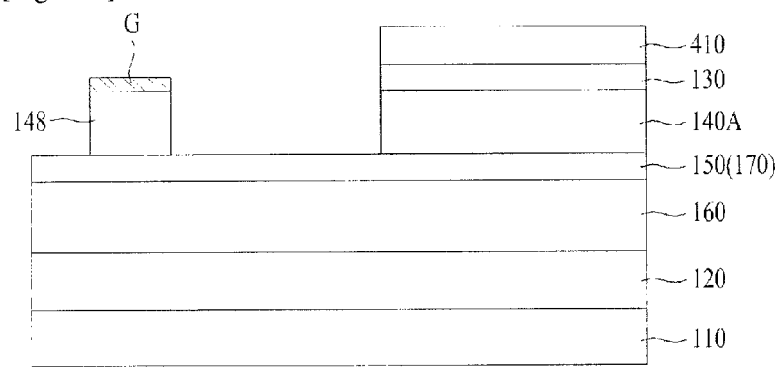
[Fig. 19e]
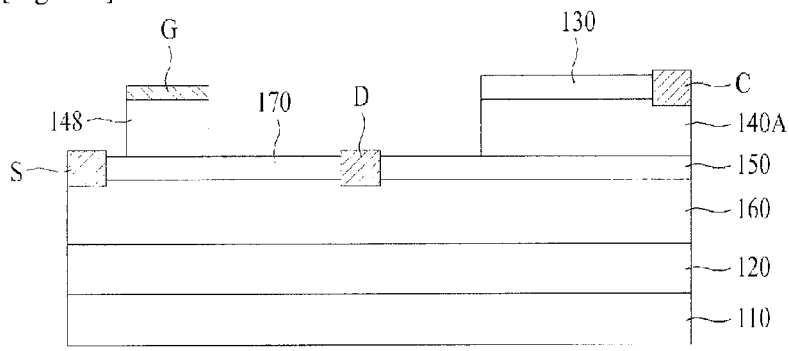

[Fig. 19f]
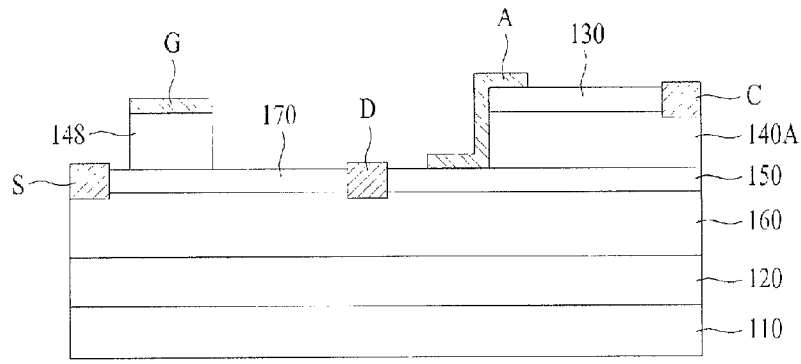
[Fig. 19g]
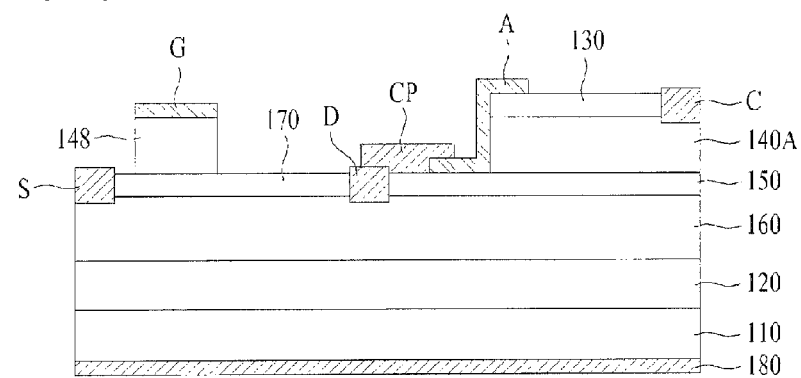
[Fig. 20a]
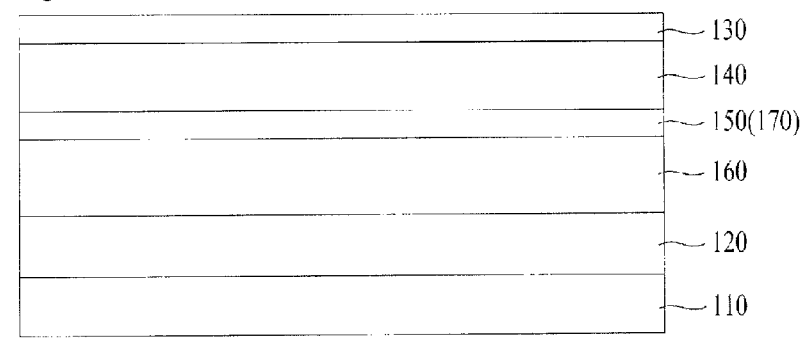
[Fig. 20b]
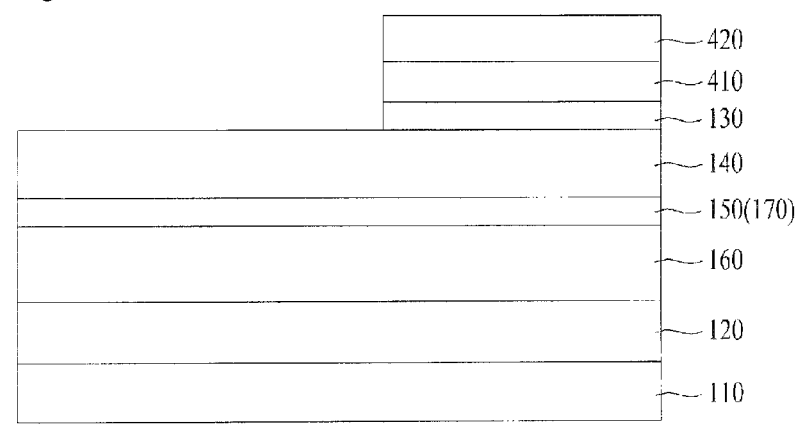

[Fig. 20c]
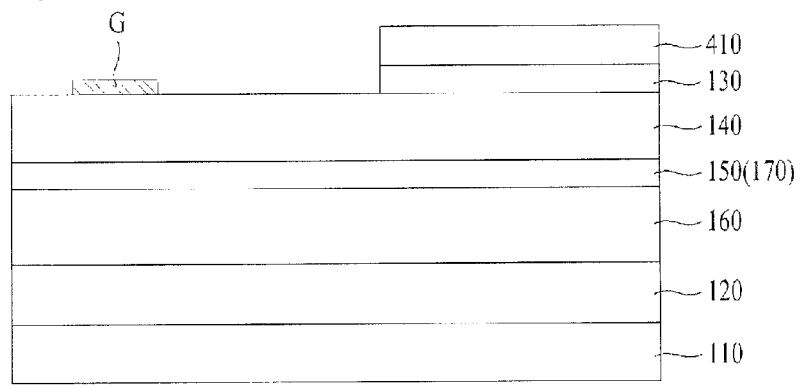
[Fig. 20d]
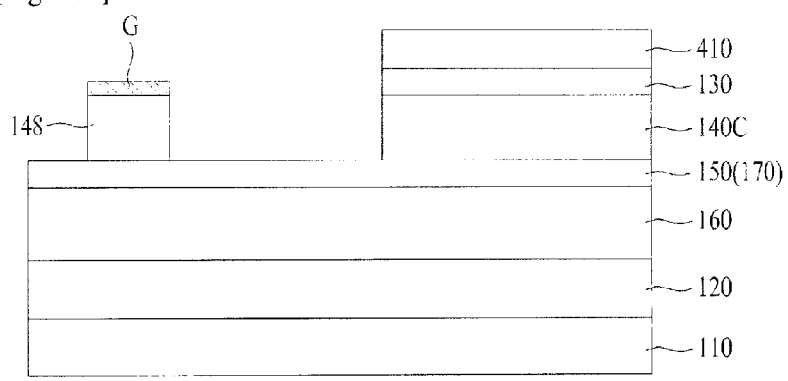
[Fig. 20e]
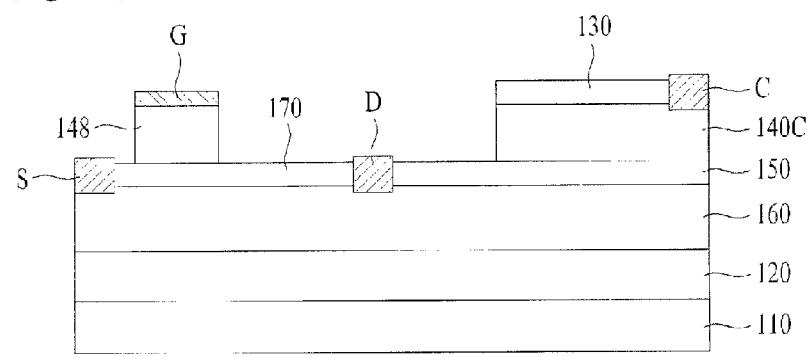
[Fig. 20f]
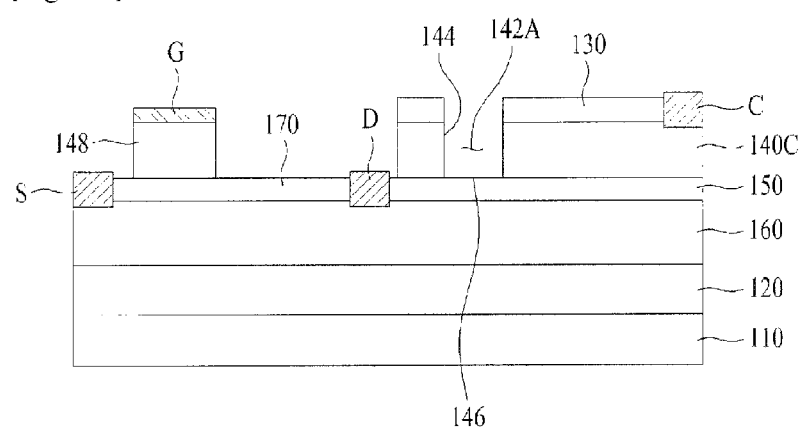

[Fig. 20g]
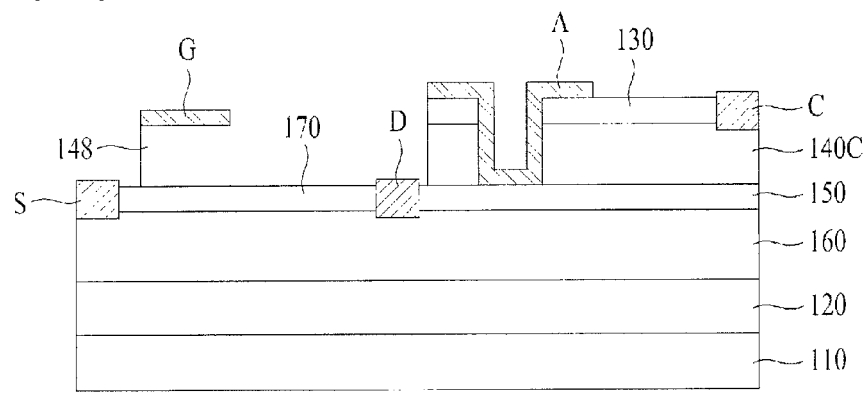
[Fig. 20h]
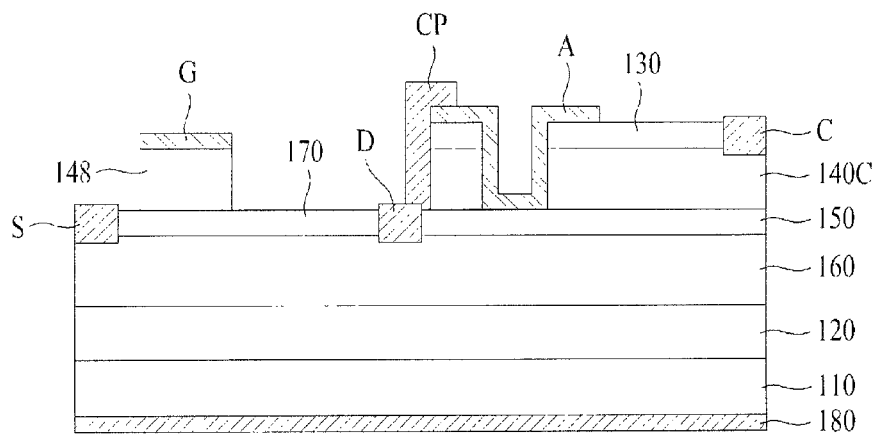
[Fig. 21]
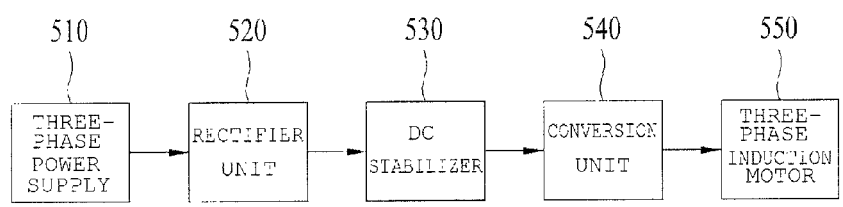

SEMICONDUCTOR DEVICE AND SEMICONDUCTOR CIRCUIT INCLUDING THE SEMICONDUCTOR DEVICE WITH ENHANCED CURRENT-VOLTAGE CHARACTERISTICS

CROSS-REFERENCE TO RELATED PATENT APPLICATIONS

This application is a U.S. National Stage Application under 35 U.S.C. ʃ371 of PCT Application No. PCT/KR2014/000518, filed Jan. 17, 2014, which claims priority to Korean Patent Application No. 10-2013-0148330, filed Dec. 2, 2013, whose entire disclosures are hereby incorporated by reference.

TECHNICAL FIELD

Embodiments relate to a semiconductor device and a semiconductor circuit including the same.

BACKGROUND ART

Plural GaN power devices such as Heterostructure Field Effect Transistors (HFETs) and Schottky diodes can be monolithically integrated.

FIG. 1 illustrates a conventional semiconductor circuit. Referring to FIG. 1, the semiconductor circuit includes an inductor L1, a HFET Q, a Schottky diode D1, and a capacitor C1. A resistor R1, representing the output load, is also shown.

FIG. 2 is a graph showing current-voltage characteristics of the Schottky diode D1 illustrated in FIG. 1. In FIG. 2, a horizontal axis represents a forward voltage of the Schottky diode D1, and a vertical axis represents a forward current of the Schottky diode D1.

The semiconductor circuit of FIG. 1 is embodied as a sort of boost converter circuit. Referring to FIG. 1, the HFET Q is turned on in response to a bias voltage BV1 applied to a gate thereof. When an input voltage VI is applied via the inductor L1 in a state in which the HFET Q is turned on, a voltage drop between an anode of the Schottky diode D1 and a reference potential may be approximately 1 V and an output voltage VO may be approximately 400 V. In this case, a cathode of the Schottky diode D1 has a greater voltage than that of the anode thereof and thus the Schottky diode D1 is turned off due to a reverse bias. When the HFET Q is turned off, however, the voltage drop between an anode of the Schottky diode D1 and a reference voltage is greater than the output voltage VO and thus the Schottky diode D1 is turned on. As such, the semiconductor circuit of FIG. 1 can boost the input voltage VI to a desired level of output voltage VO.

DISCLOSURE OF INVENTION

Technical Problem

Referring to FIGS. 1 and 2, when the HFET Q is turned off and the Schottky diode D1 is turned on, due to an electric field caused by a difference in voltage between a drift layer (or a channel layer) of the Schottky diode D1 and a substrate (not shown), a back-gate phenomenon in which the drift layer is partially depleted occurs. Due to such a back-gate phenomenon, as illustrated in FIG. 2, a resistance of the Schottky diode D1 exceeds a normal value (see plot 10) and increases in the direction indicated by an arrow (see plot 20).

Solution to Problem

Embodiments provide a semiconductor device with enhanced current-voltage characteristics in spite of a back-gate phenomenon and a semiconductor circuit including the same.

According to an embodiment of the disclosure, a semiconductor device includes a substrate and a plurality of devices on the substrate, wherein a first device of the devices includes a first nitride semiconductor layer on the substrate, a second nitride semiconductor layer brought together with the first nitride semiconductor layer to form a first heterojunction interface, between the substrate and the first nitride semiconductor layer, a third nitride semiconductor layer brought together with the second nitride semiconductor layer to form a second heterojunction interface, between the substrate and the second nitride semiconductor layer, and a first contact configured to electrically connected to the first and second heterojunction interfaces.

The first device may further include a fourth nitride semiconductor layer brought together with the third nitride semiconductor layer to form a third heterojunction interface, between the substrate and the third nitride semiconductor layer.

The first nitride semiconductor layer may have a thickness of 5 nm to 40 nm, the second nitride semiconductor layer may have a thickness of 15 nm to 100 nm, and the third nitride semiconductor layer may have a thickness of 5 nm to 40 nm.

The third and fourth nitride semiconductor layers may include different components. The third and fourth nitride semiconductor layers may include the same components and contents of the components in the third and fourth nitride semiconductor layers may differ from each other.

A second device of the devices may include a fifth nitride semiconductor layer on the substrate, a sixth nitride semiconductor layer brought together with the fifth nitride semiconductor layer to form a fourth heterojunction interface, between the substrate and the fifth nitride semiconductor layer, and a second contact configured to be connected to the fourth heterojunction interface.

The semiconductor device may further include a connection part configured to electrically connect the first contact to the second contact.

The third and fifth nitride semiconductor layers may be integrally formed, and the fourth and sixth nitride semiconductor layers may be integrally formed.

The first device may include a Schottky diode, and the second device may include a Heterostructure Field Effect Transistor.

The first contact may include a cathode and an anode configured to be respectively connected to opposite sides of the first heterojunction interface, the anode being configured to be electrically connected to the second heterojunction interface. The second contact may include a gate electrode disposed on the fifth nitride semiconductor layer and drain and source contacts disposed with the gate electrode therebetween and configured to be electrically connected to the fourth heterojunction interface, the drain contact being configured to be electrically connected to the anode via the connection part. The second device may further include a gate layer disposed between the gate electrode and the fifth nitride semiconductor layer. The gate layer and the second nitride semiconductor layer may include the same material.

The gate layer may have a thickness of 20 nm to 100 nm. At least a portion of the anode, the connection part, or the drain contact may be integrally formed. The anode may be disposed to be extended from an upper surface of the first nitride semiconductor layer via side surfaces of the first and second nitride semiconductor layers to an upper surface of the third nitride semiconductor layer. An exposed upper portion of the first nitride semiconductor layer, not covered by the anode, may have a width of 2 μm to 25 μm. The second nitride semiconductor layer may include a ledge part protruding towards the second device from a lower portion of the second nitride semiconductor layer to extend towards the second device the second heterojunction interface formed by being brought together with the third nitride semiconductor layer, and the anode may be disposed opposite to the second heterojunction interface, with the ledge part disposed therebetween and configured to be electrically connected to the second heterojunction interface via the connection part. The anode may be disposed to be extended from bottom and side surfaces of an opening formed through the first and second nitride semiconductor layer to an upper surface of the first nitride semiconductor layer. The opening may have a through-hole penetrating the first and second nitride semiconductor layers to expose the third nitride semiconductor layer or a blind-hole that does not completely penetrate the first and second nitride semiconductor layers.

The first device may include a first Heterostructure Field Effect Transistor, and the second device may include a second Heterostructure Field Effect Transistor.

The first contact may include a first gate electrode on the first nitride semiconductor layer, first drain and source contacts disposed with the first gate electrode therebetween and configured to be respectively connected to opposite sides of the first heterojunction interface, and a hole gas contact configured to electrically connect the first source contact to the connection part and the second heterojunction interface, and the connection part may be configured to connect the hole gas contact to the second contact.

The second contact may include a second gate electrode on the fifth nitride semiconductor layer and second drain and source contacts disposed with the second gate electrode therebetween and configured to be respectively connected to opposite sides of the fourth heterojunction interface, and the connection part may be configured to electrically connect the hole gas contact and the second drain contact. At least a portion of the first source contact, the hole gas contact, the connection part, or the second drain contact may be integrally formed.

The first device may include a Heterostructure Field Effect Transistor, and the second device may include a Schottky diode. In this case, the second contact may include an anode disposed on the fifth nitride semiconductor layer and a cathode configured to be connected to the fourth heterojunction interface by penetrating the fifth nitride semiconductor layer and configured to be electrically connected to the hole gas contact via the connection part. At least a portion of the first source contact, the hole gas contact, the connection part, or the cathode may be integrally formed.

The substrate may include a conductive material.

The semiconductor device may further include a metal layer disposed with facing the first and second devices on a rear surface of the substrate.

The first device may have a plane shape surrounded by the second contact. For example, the first device may have a plane shape surrounded by the gate electrode.

The second heterojunction interface may have a width that is equal to or greater than that of the first heterojunction interface.

According to another embodiment of the disclosure, a semiconductor device includes a substrate and a plurality of devices on the substrate, wherein a first device of the devices includes a first nitride semiconductor layer on the substrate, a second nitride semiconductor layer brought together with the first nitride semiconductor layer to form a first heterojunction interface, between the substrate and the first nitride semiconductor layer, a seventh nitride semiconductor layer disposed between the substrate and the second nitride semiconductor layer and doped with a p-type dopant, and a first contact configured to be electrically connected to the first heterojunction interface and the seventh nitride semiconductor layer. The p-type dopant included in the seventh nitride semiconductor layer may have a doping concentration of $10^{18}/cm^3$ to $10^{20}/cm^3$. The second nitride semiconductor layer may have a thickness of 5 nm to 500 nm.

The first device may further include a third nitride semiconductor layer disposed between the substrate and the seventh nitride semiconductor layer and a fourth nitride semiconductor layer brought together with the third nitride semiconductor layer to form a third heterojunction interface, between the substrate and the third nitride semiconductor layer.

A second device of the devices may include a fifth nitride semiconductor layer on the substrate, a sixth nitride semiconductor layer brought together with the fifth nitride semiconductor layer to form a fourth heterojunction interface, between the substrate and the fifth nitride semiconductor layer, and a second contact configured to be connected to the fourth heterojunction interface.

The second contact may include a gate electrode and the second device may further include a gate layer disposed between the gate electrode and the fifth nitride semiconductor layer. Each of the seventh nitride semiconductor layer and the gate layer may have a thickness of 20 nm to 300 nm.

According to another embodiment of the disclosure, a semiconductor device includes a substrate, first and second devices on the substrate, and a connection part configured to electrically connect the first device to the second device, wherein the first device includes a first channel layer, a first contact configured to be connected to the first channel layer, and an electric field barrier layer disposed between the first channel layer and the substrate to block an electric field therebetween, and the second device includes a second channel layer and a second contact configured to be connected to the second channel layer and to be connected to the first contact via the connection part.

The first device may further include a carrier barrier layer disposed between the electric field barrier layer and the substrate to prevent carriers from migrating into the substrate from the electric field barrier layer.

According to another embodiment of the disclosure, a semiconductor circuit includes the semiconductor device described above and a passive element connected to the semiconductor device.

The passive element may include an inductor having a first terminal configured to be connected to an input voltage and a second terminal configured to be connected to the connection part and a capacitor connected to an output voltage, the first device may be configured to be connected between the second terminal of the inductor and the output voltage, and the second device may be configured to be connected between the second terminal of the inductor and the reference potential. The first and second devices may be alternately turned on in response to a bias voltage. The second device may be turned on in response to a positive bias voltage. The second device may be turned off in response to a negative bias voltage.

The passive element may include an inductor configured to be connected between the connection part and an output voltage and a capacitor configured to be connected to the output voltage, the first device may be configured to be connected between an input voltage and the connection part, and the second device may be configured to be connected between the connection part and the reference potential.

The first and second devices may be alternately turned on in response to a bias voltage.

Advantageous Effects of Invention

In a semiconductor device and a semiconductor circuit including the same according to embodiments, even though a back-gate phenomenon occurs, an electric field between a drift layer and a substrate is blocked by an electric field barrier layer and thus current-voltage characteristics are good. Namely, an increase in resistance due to the back-gate phenomenon may be prevented and flow of carriers from the electric field barrier layer towards the substrate may be prevented by a carrier barrier layer, whereby reliability may be secured.

BRIEF DESCRIPTION OF DRAWINGS

Arrangements and embodiments may be described in detail with reference to the following drawings in which like reference numerals refer to like elements and wherein:

FIG. 1 illustrates a conventional semiconductor circuit;

FIG. 2 is a graph showing current-voltage characteristics of a Schottky diode illustrated in FIG. 1;

FIG. 3 is a sectional view of a semiconductor device according to an embodiment;

FIG. 4 is a sectional view of a semiconductor device according to another embodiment;

FIG. 5 is a sectional view of a semiconductor device according to still another embodiment;

FIG. 6 is an enlarged sectional view of another example of portion 9A illustrated in FIG. 5;

FIG. 7 is an enlarged partial sectional view of another example of portion 7A of FIG. 3;

FIG. 8 is a graph for explaining formation of a second channel layer;

FIG. 9 is a graph for explaining formation of a first channel layer and an electric field barrier layer;

FIG. 10 is a graph showing a relationship between an output voltage and electron and hole densities;

FIG. 11 is a sectional view of a semiconductor device according to still another embodiment;

FIG. 12 is a sectional view of a semiconductor device according to still another embodiment;

FIG. 13 is a sectional view of a semiconductor device according to still another embodiment;

FIG. 14 is an enlarged sectional view of another example of portion 11A illustrated in FIG. 13;

FIG. 15 is a view illustrating a semiconductor circuit including the semiconductor device of FIG. 13, according to another embodiment;

FIG. 16 is a sectional view of a semiconductor device according to still another embodiment;

FIG. 17 is a view illustrating a semiconductor circuit including the semiconductor device of FIG. 16, according to still another embodiment;

FIG. 18 is a plan view of the semiconductor device of FIG. 3, 4, 11 or 12;

FIGS. 19*a* to 19*g* are sectional views sequentially illustrating a method of manufacturing the semiconductor device of FIG. 3;

FIGS. 20*a* to 20*h* are sectional views sequentially illustrating a method of manufacturing the semiconductor device of FIG. 5; and FIG. 21 is a block diagram of a three-phase induction motor driving device according to an embodiment.

BEST MODE FOR CARRYING OUT THE INVENTION

Hereinafter, embodiments will be described in detail with reference to the annexed drawings. However, the disclosure may be embodied in many different forms and should not be construed as being limited to embodiments set forth herein. Rather, these embodiments are provided so that this disclosure will be thorough and complete, and will fully convey the scope of the disclosure to those skilled in the art.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

Also, spatially relative terms, such as "first" or "second" and "upper" or "lower," may be used herein only to distinguish one entity or element from another entity or element without necessarily requiring or implying physical or logical relationship or order between such entities or elements.

In the drawings, the thickness or size of each layer is exaggerated, omitted, or schematically illustrated for convenience of description and clarity. In addition, the size of each element does not entirely reflect the actual size thereof.

FIG. 3 is a sectional view of a semiconductor device 100A according to an embodiment.

Referring to FIG. 3, the semiconductor device 100A includes a substrate 110, a plurality of devices (e.g., first and second devices D1A and D2A), and a connection part CP (or an interconnection part).

The substrate 110 may include a conductive material. For example, the substrate 110 may be a silicon substrate, a silicon carbide substrate, or a GaN substrate, but type of the substrate 110 is not limited to the above-described examples. For example, the substrate 110 may be a silicon substrate having a (111) crystal face as a principal plane and have a thickness of 100 μm to 200 μm.

The substrate 110 may be further provided with a buffer layer 120 formed thereon. The buffer layer 120 reduces deformation caused by a difference in lattice constant between nitrides constituting the devices (e.g., D1A and D2A) disposed on the substrate 110 and the substrate 110 and prevents the effects of impurities contained in the substrate 110. For this operation, the buffer layer 120 may include at least one of AlN, GaN, SiC, or AlGaN. When the buffer layer 120 has a threshold thickness or greater, diffusion of silicon atoms from the substrate 110 may be prevented and thus occurrence of melt-back may be prevented. For this operation, the buffer layer 120 may have a thickness of tens to hundreds of nanometers, for example, 100 nm to less than 300 nm. In some embodiments, the buffer layer 120 may be omitted.

As such, the substrate 110 and the buffer layer 120 are parts shared by the devices. Each of the devices electrically connected to each other may include, for example, a Schottky diode or a Heterostructure Field Effect Transistor (HFET), but embodiments are not limited thereto.

Although FIG. 3 illustrates two devices, i.e., first and second devices D1A and D2A, disposed on the substrate 110 in a horizontal direction, the number and disposition of devices are not limited to the above-described example.

One of the devices, i.e., the first device D1A, includes first, second and third nitride semiconductor layers 130, 140A and 150 and a first contact.

First, the first nitride semiconductor layer 130 is disposed on the substrate 110.

When a thickness t1 of the first nitride semiconductor layer 130 is too small, electron density of a first channel layer CH1 (or a first drift layer) formed below a first heterojunction interface HJ1 may be reduced and a resistance of the first device D1A may increase, due to a fixed Fermi level on an upper surface of the first nitride semiconductor layer 130. On the other hand, when the thickness t1 of the first nitride semiconductor layer 130 is too great, crystallographic relaxation may be cause by strain of the first nitride semiconductor layer 130 and thus an excess of dislocation defects may be induced. Thus, the thickness t1 of the first nitride semiconductor layer 130 may be between 5 nm and 40 nm.

The second nitride semiconductor layer 140A is disposed between the substrate 110 and the first nitride semiconductor layer 130 and brought together with the first nitride semiconductor layer 130 to form the first heterojunction interface HJ1. As such, the first and second nitride semiconductor layers 130 and 140A may be formed of a material appropriate for heterojunction therebetween.

When a thickness t3A of the second nitride semiconductor layer 140A is too small, the electron density of the first channel layer CH1 may be too low and the resistance of the first device D1A may increase. On the other hand, when the thickness t3A of the second nitride semiconductor layer 140A is too great, crystallographic relaxation may be caused by strain of the second nitride semiconductor layer 140A and thus an excess of dislocation defects may be induced. Thus, the thickness t3A of the second nitride semiconductor layer 140A may be between 15 nm and 100 nm, for example, 50 nm.

The third nitride semiconductor layer 150 is disposed between the substrate 110 and the second nitride semiconductor layer 140A and brought together with the second nitride semiconductor layer 140A to form a second heterojunction interface HJ2. As such, the second and third nitride semiconductor layers 140A and 150 may be formed of a material appropriate for heterojunction therebetween.

When a thickness t4A of the third nitride semiconductor layer 150 is too small, the electron density of the second device D2A may be too low and the resistance of the second device D2A may increase, due to a fixed Fermi level on a surface of a fifth nitride semiconductor layer 170. On the other hand, when the thickness t4A of the third nitride semiconductor layer 150 is too great, a threshold voltage of the second device D2A may be too low or have a negative (−) value. Thus, the thickness t4A of the third nitride semiconductor layer 150 may be between 5 nm and 40 nm, for example, 15 nm.

The first device D1A may further include a fourth nitride semiconductor layer 160. The fourth nitride semiconductor layer 160 is disposed between the substrate 110 and the third nitride semiconductor layer 150 and brought together with the third nitride semiconductor layer 150 to form a third heterojunction interface HJ3. As such, the third and fourth nitride semiconductor layers 150 and 160 may be formed of a material appropriate for heterojunction therebetween.

Each of the first, second, third and fourth nitride semiconductor layers 130, 140A, 150 and 160 may include a Group III element-containing nitride. For example, each of the first, second, third and fourth nitride semiconductor layers 130, 140A, 150 and 160 may include at least one of GaN, AlN, or InN, or an alloy thereof, but embodiments are not limited thereto. Namely, materials of the first, second, third and fourth nitride semiconductor layers 130, 140A, 150 and 160 are not limited to the above-described examples so long as the first and second nitride semiconductor layers 130 and 140A form the first channel layer CH1 through heterojunction therebetween, the second and third nitride semiconductor layers 140A and 150 form an electric field barrier layer EFB through heterojunction therebetween, and the third and fourth nitride semiconductor layers 150 and 160 form a carrier blocking layer (CBL) through heterojunction therebetween.

For example, the first nitride semiconductor layer 130 may include AlGaN and the second nitride semiconductor layer 140A may include InGaN. In another embodiment, the first nitride semiconductor layer 130 may include AlGaN and the second nitride semiconductor layer 140A may include GaN.

In addition, the second nitride semiconductor layer 140A may include InGaN and the third nitride semiconductor layer 150 may include AlGaN. In another embodiment, the second nitride semiconductor layer 140A may include GaN and the third nitride semiconductor layer 150 may include AlGaN.

In addition, according to one embodiment, a component of the third nitride semiconductor layer 150 may differ from a component of the fourth nitride semiconductor layer 160. For example, the third nitride semiconductor layer 150 may include AlGaN and the fourth nitride semiconductor layer 160 may include GaN. In this regard, GaN included in the fourth nitride semiconductor layer 160 may be undoped.

According to another embodiment, the component of the third nitride semiconductor layer 150 may be the same as the component of the fourth nitride semiconductor layer 160, but a component content of the third nitride semiconductor layer 150 may differ from that of the fourth semiconductor layer 160. For example, each of the third and fourth nitride semiconductor layers 150 and 160 may include $Al_xGa_{1-x}N$. In this regard, an Al content (X=X1) of AlGaN included in the third nitride semiconductor layer 150 may be greater than an Al content (X=X2) of AlGaN included in the fourth nitride semiconductor layer 160. For example, X1 may be 0.25 and X2 may be 0.05, but embodiments are not limited thereto.

The first contact is a portion to which the first and second heterojunction interfaces HJ1 and HJ2 are electrically connected. Thus, when the first channel layer CH1 is formed at an upper portion of the second nitride semiconductor layer 140A below the first heterojunction interface HJ1, the first contact may be electrically connected to the first channel layer CH1. In addition, when the electric field barrier layer EFB is formed at a lower portion of the second nitride semiconductor layer 140A on the second heterojunction interface HJ2, the first contact may be electrically connected to the electric field barrier layer EFB.

According to one embodiment, as illustrated in FIG. 3, the first contact may include a cathode C and an anode A. The cathode C and the anode A are respectively connected to opposite sides of the first heterojunction interface HJ1. In particular, the anode A is electrically connected to the second heterojunction interface HJ2 as well as the first heterojunction interface HJ1. Thus, when the electric field barrier layer EFB is formed at the lower portion of the second nitride semiconductor layer 140A on the second heterojunction interface HJ2, the anode A may be electrically connected to the electric field barrier layer EFB.

The anode A need not be electrically connected directly to the second heterojunction interface HJ2 so long as the anode A is electrically connected to the electric field barrier layer EFB.

In addition, the anode A may be in Schottky contact with the first and second nitride semiconductor layers 130 and 140A, and the cathode C may be in ohmic contact with at least one of the first or second nitride semiconductor layers 130 and 140A.

In addition, the anode A may have various shapes as follows.

First, according to one embodiment, as illustrated in FIG. 3, the anode A may be disposed to be extended from an upper surface of the first nitride semiconductor layer 130 via side surfaces of the first and second nitride semiconductor layers 130 and 140A to an upper surface of the third nitride semiconductor layer 150. In this regard, a portion of the anode A extended via the side surfaces of the first and second nitride semiconductor layers 130 and 140A may be inclined, unlike the embodiment illustrated in FIG. 3.

FIG. 4 is a sectional view of a semiconductor device 100B according to another embodiment.

According to another embodiment, as illustrated in FIG. 4, the second nitride semiconductor layer 140B may include a body part (or a base part) 142 and a ledge part 144. In this regard, the body part 142 corresponds to and has the same shape as the second nitride semiconductor layer 140A of FIG. 3. The ledge part 144 protrudes towards the second device D2A from a lower portion of the body part 142 and thus extends towards the second device D2A the second heterojunction interface HJ2 formed by being brought together with the third nitride semiconductor layer 150.

The anode A may be disposed on the ledge part 144 so as to face the second heterojunction interface HJ2 and be electrically connected to the electric field barrier layer EFB formed on the second heterojunction interface HJ2 via the connection part CP. While the anode A illustrated in FIG. 3 is directly connected to the electric field barrier layer EFB formed on the second heterojunction interface HJ2, the anode A illustrated in FIG. 4 is indirectly connected via the connection part CP to the electric field barrier layer EFB formed on the second heterojunction interface HJ2. For this configuration, the connection part CP is connected to the electric field barrier layer EFB formed on the second heterojunction interface HJ2.

As illustrated in FIG. 4, when the second nitride semiconductor layer 140B further includes the ledge part 144, a contact area of the anode A may be relatively wider.

The semiconductor device 100B of FIG. 4 includes the same elements as those of the semiconductor device 100A of FIG. 3, except that the second nitride semiconductor layer 140B of the semiconductor device 100B further includes the ledge part 144 and the anode A is indirectly connected to the second heterojunction interface HJ2, i.e., the electric field barrier layer EFB, and thus a detailed description thereof will be omitted herein.

FIG. 5 is a sectional view of a semiconductor device 100C according to still another embodiment.

FIG. 6 is an enlarged sectional view of another example 9B of portion 9A illustrated in FIG. 5.

As illustrated in FIG. 5 or 6, the anode A may be disposed to be extended from a bottom surface 146 and side surfaces 144 of an opening 142A formed through the first and second nitride semiconductor layers 130 and 140C to an upper surface of the first nitride semiconductor layer 130. In this regard, as illustrated in FIG. 5, the opening 142A may be a through-hole to expose an upper surface of the third nitride semiconductor layer 150 by penetrating the first and second nitride semiconductor layers 130 and 140C. In another embodiment, as illustrated in FIG. 6, the opening 142B may be a blind-hole that does not completely penetrate the first and second nitride semiconductor layers 130 and 140C.

In this case, the connection part CP extends on side surfaces of the first and second nitride semiconductor layers 130 and 140C to be electrically connected to the anode A.

The semiconductor device 100C of FIG. 5 includes the same elements as those of the semiconductor device 100A of FIG. 3, except that the anode A and the connection part CP of the semiconductor device 100C have different shapes than those of the anode A and the connection part CP of the semiconductor device 100A and thus a detailed description thereof will be omitted herein.

Meanwhile, referring back to FIG. 3, another of the devices, i.e., the second device D2A, may include the fifth nitride semiconductor layer 170, the sixth nitride semiconductor layer 160, and a second contact.

The fifth nitride semiconductor layer 170 is disposed on the substrate 110. As illustrated in FIG. 3, the fifth nitride semiconductor layer 170 and the third nitride semiconductor layer 150 may be integrally formed, but embodiments are not limited thereto.

The sixth nitride semiconductor layer 160 is disposed between the substrate 110 and the fifth nitride semiconductor layer 170. As illustrated in FIG. 3, the sixth nitride semiconductor layer 160 and the fourth nitride semiconductor layer 160 may be integrally formed, but embodiments are not limited thereto. The sixth nitride semiconductor layer 160 forms a fourth heterojunction interface HJ4 by be brought together with the fifth nitride semiconductor layer 170. As such, the fifth and sixth nitride semiconductor layers 170 and 160 may be formed of a material appropriate for heterojunction therebetween.

Each of the fifth and sixth nitride semiconductor layers 170 and 160 may include a Group III element-containing nitride. For example, each of the fifth and sixth nitride semiconductor layers 170 and 160 may include at least one of GaN, AlN, or InN, or an alloy thereof, but embodiments are not limited thereto.

The second contact is a portion electrically connected to the fourth heterojunction interface HJ4. Thus, when a second channel layer CH2 is formed at an upper portion of the sixth nitride semiconductor layer 160 below the fourth heterojunction interface HJ4, the second contact may be electrically connected to the second channel layer CH2.

According to one embodiment, the second contact may include a gate electrode G, a drain contact D, and a source contact S. The gate electrode G is disposed on the fifth nitride semiconductor layer 170. The drain and source contacts D and S are disposed with the gate electrode G therebetween and electrically connected to the fourth heterojunction interface HJ4. Thus, when the second channel layer CH2 below the fourth heterojunction interface HJ4 is formed, the drain and source contacts D and S may be electrically connected to the second channel layer CH2.

Referring to FIG. 3, the second device D2A may further include a gate layer 148. The gate layer 148 may include an insulating material.

The gate layer 148 is disposed between the gate electrode G and the fifth nitride semiconductor layer 170. The gate layer 148 and the second nitride semiconductor layer 140 may include the same material, but embodiments are not limited thereto.

When a thickness t2A of the gate layer 148 is too small, a threshold voltage for turning on the second device D2A may be too low or have a negative (−) value. On the other hand, when the thickness t2A of the gate layer 148 is too great, crystallographic relaxation may be cause by strain of the gate layer 148 and thus the threshold voltage of the second device D2A may be reduced, which results in occurrence of an excess of dislocation defects. Thus, the thickness t2A of the gate layer 148 may be between 15 nm and 100 nm, for example, between 20 nm and 100 nm. In this regard, the thickness t2A of the gate layer 148 may be the same as the thickness t3A of the second nitride semiconductor layer 140A, but embodiments are not limited thereto.

The connection part CP electrically connects the first contact to the second contact. Referring to FIG. 3, the connection part CP electrically connects the anode A of the first contact to the drain contact D of the second contact. For example, the connection part CP may be formed as a single layer or multiple layers including material with electrical conductivity, e.g., at least one of Cr, Al, Ti, or Au.

FIG. 7 is an enlarged partial sectional view of another example 7B of portion 7A of FIG. 3.

As illustrated in FIG. 3, the anode A of the first contact, the connection part CP, and the drain contact D of the second contact may each be independently formed. In another embodiment, at least a portion of the anode A, the connection part CP, or the drain contact D may be integrally formed. For example, as illustrated in FIG. 7, the anode A, the connection part CP, and the drain contact D may be integrally formed.

In addition, each of the semiconductor devices 100A, 100B and 100C according to the embodiments may further include a metal layer 180. The metal layer 180 is disposed to face the first device D1A, D1B or D1C and the second device D2A on a rear surface of the substrate 110. The metal layer 180 may be formed of the same or different materials as that of the connection part CP. For example, the metal layer 180 may include material with electrical conductivity, e.g., at least one of Cr, Ni, Ti, or Au and have a single layer or multilayer structure.

According to one embodiment, as illustrated in FIGS. 3 to 5, in the semiconductor devices 100A, 100B and 100C, the first device D1A, D1B or D1C may include a Schottky diode and the second device D2A may include a Heterostructure Field Effect Transistor (HFET). In this case, the semiconductor devices 100A, 100B and 100C of FIGS. 3 to 5 may be applied to a boost converter circuit illustrated in FIG. 1, but embodiments are not limited thereto. Namely, the semiconductor devices 100A, 100B and 100C may also be connected in various other forms than that illustrated in FIG. 1 to passive elements L1, C1 and R1 of FIG. 1 according to applications thereof.

The semiconductor circuit of FIG. 1 includes, as passive elements, an inductor L1, and a capacitor C1. A resistor R1, representing the output load, is also shown. The inductor L1 has a first terminal connected to an input voltage VI and a second terminal connected to a connection part (CP) P1. The capacitor C1 is connected to the output voltage VO. The capacitor C1 is connected in parallel with the output load between an output voltage VO and a reference potential. The Schottky diode D1, which is a first device of the devices, is connected between the second terminal of the inductor L1 and the output voltage VO, and the HFET Q, which is a second device of the devices, is connected between the second terminal of the inductor L1 and the reference potential.

Hereinafter, the semiconductor circuit illustrated in FIG. 1 will be described by way of example for easier understanding, but embodiments are not limited thereto. In this case, a first node N1 of FIGS. 3 to 5 is connected to the output voltage VO, a second node N2 of FIGS. 3 to 5 is connected to the inductor L1 and a contact point P1 of the HFET Q, and each of a fourth node N4 and a fifth node N5 of FIGS. 3 to 5 is connected to the reference potential, i.e., ground.

FIG. 8 is a graph for explaining formation of the second channel layer CH2. In FIG. 8, a horizontal axis denotes a distance in the direction of line A-A' of FIG. 3, and a vertical axis denotes a conduction band energy (Ec) level, a valence band energy (Ev) level, and an electron density of the second channel layer CH2.

In a case in which the semiconductor devices 100A, 100B and 100C illustrated in FIGS. 3 to 5 are applied to the boost converter circuit illustrated in FIG. 1, when a high bias voltage BV1 is applied via a third node N3, the second channel layer CH2 is formed and thus the HFET Q as the second device D2A is turned on. For this operation, the drain contact D and the source contact S are electrically connected by the second channel layer CH2. When the fifth and sixth nitride semiconductor layers 170 and 160 having different lattice constants form the fourth heterojunction interface HJ4, positive polarization charge due to spontaneous polarization and piezoelectric polarization is caused. Thus, referring to FIGS. 3 to 5 and 8, a two-dimensional electron gas (2-DEG) layer 202, corresponding to the second channel layer CH2 of the second device D2A, may be formed at an upper portion of the sixth nitride semiconductor layer 160 below the fourth heterojunction interface HJ4 (x3). Namely, the second channel layer CH2 may be formed when the high bias voltage BV1 is applied to the gate electrode G and the fifth and sixth nitride semiconductor layers 170 and 160 form a heterojunction. The electron sheet density of the 2-DEG gas 202, which is the second channel layer CH2, may for example be $5.4 \times 10^{12}/cm^2$.

In a state in which the second channel layer CH2 is formed, a voltage of the contact point P1 of the anode A of the Schottky diode D1, D1A, D1B or D1C is 1 V and the output voltage VO of the cathode C thereof is higher than 1 V, e.g., 400 V, and thus the Schottky diode D1, D1A, D1B or D1C is reverse-biased and thus turned off because the first channel layer CH1 is not formed.

FIG. 9 is a graph for explaining formation of the first channel layer CH1 and the electric field barrier layer EFB. In FIG. 9, a horizontal axis denotes a distance in the direction of line B-B' of FIG. 3, and a vertical axis denotes a conduction band energy (Ec) level, a valence band energy (Ev) level, an electron density of the second channel layer CH2, and a hole density of the electric field barrier layer EFB.

When the low bias voltage BV1 is applied via the third node N3, the second channel layer CH2 is depleted due to a high voltage between the drain contact D and the source contact S across the second device D2A and thus the second channel layer CH2 of the HFET Q as the second device D2A is depleted, which causes the HFET Q to turn off. In this case, a first voltage of the anode A of the Schottky diode D1, D1A, D1B or D1C is higher than a second voltage of the anode C. For example, the first voltage may be 401 V and the second voltage may be 400 V. In this case, the Schottky diode D1, D1A, D1B or D1C is forward-biased and thus the first channel layer CH1 (or a drift layer) is formed, which causes the Schottky diode D1, D1A, D1B or D1C to turn on. When the first nitride semiconductor layer 130 and the second nitride semiconductor layer 140A, 140B or 140C that have lattice constants different from each other form the first heterojunction interface HJ1, spontaneous polarization and piezoelectric polarization are caused, and thus, a 2-DEG layer 212, corresponding to the first channel layer CH1 of the first device D1, D1A, D1B or D1C, may be formed at the upper surface of the second nitride semiconductor layer 140A, 140B or 140C below the first heterojunction interface HJ1 (y2). The electron sheet density of the 2-DEG layer 212, which is the first channel layer CH1, may for example be $7.4 \times 10^{12}/cm^2$.

In addition, when the second nitride semiconductor layer 140A, 140B or 140C and the third nitride semiconductor layer 150 that have lattice constants different from each other form the second heterojunction interface HJ2, negative polarization charge is caused and thus a two-dimensional hole gas (2-DHG) layer 214 as the electric field barrier layer EFB may be formed at a lower portion of the second nitride semiconductor layer 140A, 140B or 140C on the second heterojunction interface HJ2 (y3). In this regard, as illustrated in FIG. 3, 5 or 7, the anode A of the first contact is electrically connected directly to the electric field barrier layer EFB and, as illustrated in FIG. 4 or 6, the anode A is electrically connected to the electric field barrier layer EFB via the connection part CP.

As a back-gate phenomenon, electric field EF may be caused due to a difference in potential between the first channel layer CH1 and the substrate 110 in the direction indicated by an arrow. According to an embodiment, however, the electric field barrier layer EFB is disposed between the first channel layer CH1 and the substrate 110 and thus blocks electric field EF, which results in prevention of partial depletion of the first channel layer CH1 due to the electric field EF. Namely, the electric field barrier layer EFB serves to prevent the first channel layer CH1 from being affected by the back-gate phenomenon. For this operation, according to an embodiment, the second heterojunction interface HJ2 may have a width that is equal to or greater than that of the first heterojunction interface HJ1.

When a potential Vgs between the third and fourth nodes N3 and N4 is 0 V, a potential at the contact point P1 is greater than the output voltage VO by 1 V, the substrate 110 is a silicon substrate doped with a p-type dopant, the buffer layer 120 has a double layer structure including AlN/AlGaN, the first nitride semiconductor layer 130 is formed of $Al_{0.15}Ga_{0.85}N$ and has a thickness of 20 nm, the second nitride semiconductor layer 140A, 140B or 140C is formed of $In_{0.05}Ga_{0.95}N$ and has a thickness of 60 nm, and the third nitride semiconductor layer 150 is formed of $Al_{0.2}Ga_{0.8}N$ and has a thickness of 10 nm, an electron sheet density ns of the first channel layer CH1 and a hole sheet density ps of the electric field barrier layer EFB, which determines a diode resistance of the first device D1, D1A, D1B or D1C, are as follows.

FIG. 10 is a graph showing a relationship among the output voltage VO, electron sheet density ns 224, and hole sheet density ps 222. In FIG. 10, a horizontal axis denotes the output voltage VO and a vertical axis denotes the electron sheet density ns and the hole sheet density ps.

Referring to FIG. 10, the hole sheet density ps 222 of the electric field barrier layer EFB increases as the output voltage VO increases and thus electrons of the 2-DEG layer, which is the first channel layer CH1, may not be affected by the electric field EF. By contrast, the electron sheet density ns 224 of the first channel layer CH1 may be kept almost constant by virtue of the electric field barrier layer EFB independently of the output voltage VO.

Meanwhile, when the third nitride semiconductor layer 150 and the fourth nitride semiconductor layer 160 that have lattice constants different from each other form the third heterojunction interface HJ3 (y4), positive polarization charge is caused therebetween while the electric field barrier layer EFB is formed and thus a carrier barrier layer CBL may be formed at the upper surface of the fourth nitride semiconductor layer 160 below the third heterojunction interface HJ3 (y4). The carrier barrier layer CBL serves as a sort of hole barrier layer that prevents carriers of the electric field barrier layer EFB, i.e., holes, from migrating into the substrate 110.

Meanwhile, as described above, in the semiconductor circuit of FIG. 1 including the above-described semiconductor device 100A, 100B or 100C, the first device D1, D1A, D1B or D1C and the HFET Q of the second device D2A may be alternately turned on in response to the bias voltage BV1.

For example, in the semiconductor devices 100A, 100B and 100C illustrated in FIGS. 3 to 7, when the high bias voltage BV1 is applied, the first device D1, D1A, D1B or D1C is turned off and the second device D2A is turned on and on the other hand, when the low bias voltage BV1 is applied, the first device D1, D1A, D1B or D1C is turned on and the second device D2A is turned off. However, embodiments are not limited to the above-described examples.

FIG. 11 is a sectional view of a semiconductor device 100D according to still another embodiment.

While the semiconductor device 100A of FIG. 3 includes the gate layer 148, the semiconductor device 100D of FIG. 11 does not include the gate layer 148. Except for this difference, the semiconductor device 100D of FIG. 11 includes the same elements as those of the semiconductor device 100A of FIG. 3 and thus a detailed description thereof will be omitted herein.

While the semiconductor device 100A of FIG. 3 is operated in a normally-off mode whereby the semiconductor device 100A is turned on when the positive bias voltage BV1 is applied to the gate electrode G and turned off when the zero bias voltage BV1 is applied thereto, the semiconductor device 100D of FIG. 11 is operated in a normally-on mode whereby the semiconductor device 100D is turned off when the negative bias voltage BV1 is applied to the gate electrode G and turned on when the zero bias voltage BV1 is applied thereto.

In the semiconductor device 100D of FIG. 11, when a thickness t3B of the second nitride semiconductor layer 140A is too small, an electron density of the first channel layer CH1 may be too low and the resistance of the first device D1A may increase. On the other hand, when the thickness t3B of the second nitride semiconductor layer 140A is too great, crystallographic relaxation may be cause by strain of the second nitride semiconductor layer 140A and thus an excess of dislocation defects may be induced. Thus, the thickness t3B of the second nitride semiconductor layer 140A may be between 15 nm and 100 nm.

In addition, in a case in which the third and fifth nitride semiconductor layers 150 and 170 illustrated in FIG. 11 are integrally formed, when a thickness t4B of the third and fifth nitride semiconductor layers 150 and 170 is too small, electron density of the second channel layer CH2 may be too low and the resistance of the second device D2A may increase, due to a fixed Fermi level on a surface of the fifth nitride semiconductor layer 170. On the other hand, when the thickness t4B of the third and fifth nitride semiconductor layers 150 and 170 is too great, crystallographic relaxation may be cause by strain of the third and fifth nitride semiconductor layers 150 and 170 and thus an excess of dislocation defects may be induced. Thus, the thickness t4B of the third and fifth nitride semiconductor layers 150 and 170 may be between 5 nm and 40 nm. As such, the thickness t4B of the third and fifth nitride semiconductor layers 150 and 170 may be greater by 10 nm than that of the third and fifth nitride semiconductor layers 150 and 170 of the semiconductor device 100A, 100B or 100C illustrated in FIGS. 3 to 7.

FIG. 12 is a sectional view of a semiconductor device 100E according to still another embodiment.

Unlike the semiconductor device 100A of FIG. 3, the semiconductor device 100E of FIG. 12 may further include a seventh nitride semiconductor layer 190. The seventh nitride semiconductor layer 190 may be disposed between the substrate 110 and a second nitride semiconductor layer 140D, i.e., between the second and third nitride semiconductor layers 140D and 150 and doped with a p-type dopant such as Mg, Zn, Ca, Sr, Ba, or the like. In addition, the seventh nitride semiconductor layer 190 may include a Group III element-containing nitride, for example, at least one of AlN, GaN, or InN or an alloy thereof. Impurity charges ionized in the seventh nitride semiconductor layer 190 doped with the p-type dopant generate a hole gas and thus the seventh nitride semiconductor layer 190 may serve as the electric field barrier layer EFB. Therefore, the second and third nitride semiconductor layers 140D and 150 are disposed with the seventh nitride semiconductor layer 190 therebetween while being spaced apart from each other and thus a heterojunction therebetween need not be formed.

The semiconductor device 100E of FIG. 12 includes the same elements as those of the semiconductor devices 100A, 100B and 100C illustrated in FIGS. 3 to 7, except that, as described above, the semiconductor device 100E further includes the seventh nitride semiconductor layer 190 and the second and third nitride semiconductor layers 140D and 150 need not form a heterojunction and thus a detailed description thereof will be omitted herein.

In the semiconductor device 100E of FIG. 12, a first contact may be electrically connected to the first heterojunction interface HJ1 and the seventh nitride semiconductor layer 190. For example, an anode A of the first contact may be electrically connected to the first channel layer CH1 below the first heterojunction interface HJ1 and the seventh nitride semiconductor layer 190.

In addition, the p-type dopant included in the seventh nitride semiconductor layer 190 may have a doping concentration of $10^{18}/cm^3$ to $10^{20}/cm^3$.

In addition, when a thickness t3C of the second nitride semiconductor layer 140D is too small, the p-type dopant included in the seventh nitride semiconductor layer 190 is diffused into the first channel layer CH1 and thus the resistance of a first device D1D may increase. On the other hand, when the thickness t3C of the second nitride semiconductor layer 140D is too great, manufacturing costs may increase and it may be difficult to manufacture the semiconductor device 100E. Thus, the thickness t3C of the second nitride semiconductor layer 140D may be between 5 nm and 500 nm.

In addition, when a thickness t2B of a gate layer 198 is too small, a threshold voltage that turns on the second device D2A may be too low and even have a negative (−) value. On the other hand, when the thickness t2B of the gate layer 198 is too great, manufacturing costs may be high and it may be difficult to manufacture the semiconductor device 100E. Thus, the thickness t2B of the gate layer 198 may be between 20 nm and 300 nm. The gate layer 198 may include the same or different materials as the seventh nitride semiconductor layer 190, and the thickness t2B of the gate layer 198 may be the same as a thickness t5 of the seventh nitride semiconductor layer 190.

The gate layer 198 may be doped p-type.

FIG. 13 is a sectional view of a semiconductor device 100F according to still another embodiment.

As illustrated in FIG. 13, a first device D1E may include a first HFET and a second device D2B may include a second HFET. The semiconductor device 100F includes the same elements as those of the semiconductor devices 100A, 100B, 100C, 100D and 100E illustrated in FIGS. 3 to 12, except that the semiconductor device 100F includes first and second contacts having different types and shapes and thus a detailed description thereof will be omitted herein.

Referring to FIG. 13, the first contact includes a first gate electrode G1, a first drain contact D1, a first source contact S1, and a hole gas contact HGC. The first gate electrode G1 is disposed on the first nitride semiconductor layer 130. The first drain contact D1 and the first source contact S1 are disposed with the first gate electrode G1 therebetween and thus are respectively connected to opposite sides of the first heterojunction interface HJ1. Thus, when the first channel layer CH1 is formed below the first heterojunction interface HJ1, the first drain contact D1 and the first source contact S1 may be electrically connected respectively to opposite sides of the first channel layer CH1.

The hole gas contact HGC connects the first source contact S1 to the connection part CP and to the second heterojunction interface HJ2. As such, since the hole gas contact HGC is connected to the second heterojunction interface HJ2, when the electric field barrier layer EFB is formed, the hole gas contact HGC may be electrically connected to the electric field barrier layer EFB.

For this configuration, the hole gas contact HGC is disposed so as to be extended from upper and side surfaces of the first source contact S1 via a side surface of a second nitride semiconductor layer 140E to an upper surface of the third nitride semiconductor layer 150. In this regard, according to an embodiment, the hole gas contact HGC extended along the side surface of the first source contact S1 and the side surface of the second nitride semiconductor layer 140E may be inclined, unlike the embodiment illustrated in FIG. 13.

In addition, unlike illustrated in FIG. 13, the hole gas contact HGC, the first nitride semiconductor layer 130, and the second nitride semiconductor layer 140E may be embodied as the anode A, the first nitride semiconductor layer 130, and the second nitride semiconductor layer 140B or 140C are embodied in each of FIGS. 4, 5 and 6.

In addition, the seventh nitride semiconductor layer 190 as illustrated in FIG. 12 may be disposed between the second and third nitride semiconductor layers 140E and 150 illustrated in FIG. 13.

In addition, the second contact illustrated in FIG. 13 includes a second gate electrode G2, a second source contact S2, and a second drain contact D2. The second gate electrode G2 is disposed on the fifth nitride semiconductor layer 170. The second drain contact D2 and the second source contact S2 are disposed with the second gate electrode G2 therebetween and thus are respectively connected to opposite sides of the fourth heterojunction interface HJ4. Thus, when the second channel layer CH2 is formed, the second drain contact D2 and the second source contact S2 may be electrically connected respectively to opposite sides of the second channel layer CH2.

The connection part CP connects the hole gas contact HGC to the second contact of the second device D2B. Namely, the connection part CP electrically connects the hole gas contact HGC and the second drain contact D2.

In addition, the second nitride semiconductor layer 140E of the semiconductor device 100F of FIG. 13 corresponds to the second nitride semiconductor layer 140A of FIG. 3 and the second nitride semiconductor layers 140A and 140E may have thicknesses different from each other. When a thickness t3D of the second nitride semiconductor layer 140E is too small, electron density of the 2-DEG layer, which is the first channel layer CH1, may be too low and the resistance of the first device DIE may increase. On the other hand, when the thickness t3D of the second nitride semiconductor layer 140E is too great, crystallographic relaxation may be cause by strain of the second nitride semiconductor layer 140E and thus an excess of dislocation defects may be included. Thus, the thickness t3D of the second nitride semiconductor layer 140E may be between 15 nm and 100 nm.

FIG. 14 is an enlarged sectional view of another example 11B of portion 11A illustrated in FIG. 13.

As illustrated in FIG. 13, the first source contact S1, the hole gas contact HGC, the connection part CP, and the second drain contact D2 may be separately formed. In another embodiment, at least a portion of the first source contact S1, the hole gas contact HGC, the connection part CP, or the second drain contact D2 may be integrally formed. For example, as illustrated in FIG. 14, the first source contact S1, the hole gas contact HGC, the connection part CP, and the second drain contact D2 may be integrally formed.

FIG. 15 is a view illustrating a semiconductor circuit including the semiconductor device 100F of FIG. 13, according to another embodiment.

The semiconductor device 100F of FIG. 13 may be applied to a synchronous buck converter as the semiconductor circuit illustrated in FIG. 15, but embodiments are not limited thereto. Namely, the semiconductor device 100F may be coupled to various passive elements according to applications thereof.

Referring to FIG. 15, the semiconductor circuit includes, as passive elements, an inductor L2 and a capacitor C2. A resistor R2, representing the output load, is also shown. The inductor L2 is connected between a contact point P2 corresponding to the connection part CP and an output voltage VO. The capacitor C2 is connected to the output voltage VO. The capacitor C2 is connected in parallel with the output load between the output voltage VO and a reference potential. A first HFET Q1, which is a first device of the devices, is connected between an input voltage VI and the contact point P2, which is the connection part CP. A second HFET Q2 as a second device of the devices is connected between the contact point P2, i.e., the connection part CP, and the reference potential.

A first node N1 illustrated in FIG. 13 may be connected to the input voltage VI, a second node N2 of FIG. 13 may be connected to the contact point P2, a second bias voltage BV2 may be applied to a third node N3 of FIG. 13, each of a fourth node N4 and a fifth node N5 of FIG. 13 may be connected to ground as the reference potential, and the first bias voltage BV1 may be applied to a sixth node N6 of FIG. 13.

The first HFET Q1 as a first device may be turned on in response to the first bias voltage BV1, and the second HFET Q2 as a second device may be turned on in response to the second bias voltage BV2. The first and second devices Q1 and Q2 may be alternately turned on.

FIG. 16 is a sectional view of a semiconductor device 100G according to still another embodiment.

As illustrated in FIG. 16, the first device D1E may include an HFET, and a second device D2C may include a Schottky diode.

While the second device D2B of the semiconductor device 100F of FIG. 13 includes the second HFET, the second device D2C of the semiconductor device 100G of FIG. 16 includes the Schottky diode. Except for this difference, the semiconductor device 100G of FIG. 16 includes the same elements as those of the semiconductor device 100F of FIG. 13 and thus a detailed description thereof will be omitted herein.

Referring to FIG. 16, a second contact includes the anode A and the cathode C. The anode A is disposed on the fifth nitride semiconductor layer 170. The cathode C is connected to the fourth heterojunction interface HJ4 by penetrating the fifth nitride semiconductor layer 170 and is electrically connected to the hole gas contact HGC through the connection part CP. Thus, when the second channel layer CH2 is formed, the cathode C electrically connected to the fourth heterojunction interface HJ4 may be electrically connected to the second channel layer CH2.

In this regard, as illustrated in FIG. 16, the first source contact S1, the hole gas contact HGC, the connection part CP, and the cathode C may be separately formed, but embodiments are not limited thereto. Namely, at least a portion of the first source contact S1, the hole gas contact HGC, the connection part CP, or the cathode C may be integrally formed. For example, the first source contact S1, the hole gas contact HGC, the connection part CP, and the cathode C may be integrally formed.

FIG. 17 is a view illustrating a semiconductor circuit including the semiconductor device 100G of FIG. 16, according to still another embodiment.

The semiconductor device 100G of FIG. 16 may be applied to a buck converter (or a direct current (DC) stabilizer) as illustrated in FIG. 17 as the semiconductor circuit, but embodiments are not limited thereto. Namely, the semiconductor device 100G may be coupled to passive elements in various forms according to applications thereof.

The semiconductor circuit of FIG. 17 includes the same elements as those of the semiconductor circuit illustrated in FIG. 15, except that the semiconductor circuit of FIG. 17 includes a Schottky diode D2 instead of the second HFET Q2 of the semiconductor circuit of FIG. 15 and thus a detailed description thereof will be omitted herein. Namely, connection form of the passive elements in the semiconductor circuit of FIG. 17 is the same as that in the semiconductor circuit of FIG. 15. The HFET Q1 as a first device may be turned on in response to the first bias voltage BV1, and the Schottky diode D2 as a second device may be turned on when the HFET Q1 is turned off.

Referring to FIG. 17, the first node N1 of FIG. 16 may be connected to the input voltage VI, the second node N2 of FIG. 16 may be connected to a contact point P3, and each of the fourth and fifth nodes N4 and N5 may be connected to ground as the reference potential, and the first bias voltage BV1 may be applied to the sixth node N6 of FIG. 16. Operations of the semiconductor circuit of FIG. 17 will now be described schematically.

When the HFET Q1 is turned off in response to the first bias voltage BV1, supply of DC input voltage VI is stopped and thus current flows in the resistor R2 and the Schottky diode D2 by voltage between opposite terminals of the capacitor C2 and energy is accumulated in the inductor L2.

In this regard, when the HFET Q1 is turned on in response to the first bias voltage BV1, the Schottky diode D2 is turned off, and the DC input voltage VI is recharged in the capacitor C2 via the inductor L2. Simultaneously, current flows towards the resistor R2.

Thus, in the semiconductor circuit of FIG. 17, the HFET Q1 is turned off by the first bias voltage BV1 when a voltage having an excess level is applied to the resistor R2, whereby the output voltage VO may be stabilized.

In the above-described semiconductor devices 100A to 100G, the gate electrode G, G1 or G2 may include a metal material. For example, the gate electrode G, G1 or G2 may include a refractory metal or a mixture thereof. In another embodiment, the gate electrode G, G1 or G2 may be formed as a single layer or multiple layers including at least one material selected from among nickel (Ni), gold (Au), platinum (Pt), tantalum (Ta), tantalum nitride (TaN), titanium nitride (TiN), palladium (Pd), tungsten (W), and tungsten silicide ($WSi_2$). For example, the gate electrode G, G1 or G2 may have a structure including multiple layers formed of Ni/Au or a single layer formed of Pt.

In addition, the source contact S, S1 or S2 and the drain contact D, D1 or D2 may be formed of a metal. In addition, the source contact S, S1 or S2 and the drain contact D, D1 or D2 may include the same material as that of the gate electrode G, G1 or G2. In addition, the source contact S, S1 or S2 and the drain contact D, D1 or D2 may be formed of an electrode material with ohmic characteristics. For example, the source contact S, S1 or S2 and the drain contact D, D1 or D2 may be formed as a single layer or multiple layers including at least one of aluminum (Al), titanium (Ti), chromium (Cr), nickel (Ni), copper (Cu), gold (Au), or molybdenum (Mo). For example, the source contact S, S1 or S2 and the drain contact D, D1 or D2 may have a structure including multiple layers formed of Ti/Al or Ti/Mo.

In addition, the cathode C may be formed of a metal material with ohmic characteristics. For example, the cathode C may be formed as a single layer or multiple layers including at least one of Al, Ti, Cr, Ni, Cu, or Au. In addition, the anode A may include a metal material. For example, the anode A may include a refractory metal or a mixture thereof. In another embodiment, the anode A may include at least one material selected from among Pt, germanium (Ge), Cu, Cr, Ni, Au, Ti, Al, Ta, TaN, TiN, Pd, W, and $WSi_2$.

Meanwhile, in the semiconductor devices 100A, 100B, 100C, 100D and 100E respectively illustrated in FIGS. 3, 4, 5, 11 and 12 and the semiconductor devices 100F and 100G respectively illustrated in FIGS. 13 and 16 according to the above-described embodiments, when a width W1 or W2 of an exposed portion of the first nitride semiconductor layer 130 that is not covered by the first contact is too small, breakdown voltage of the first devices D1A to D1E may be too low. On the other hand, when the width W1 or W2 of the exposed portion of the first nitride semiconductor layer 130 is too great, resistance of the first devices D1A to D1E may increase. Thus, each of the upper widths W1 and W2 of the exposed portion of the first nitride semiconductor layer 130 may be between 2 μm and 25 μm.

FIG. 18 is a plan view of the semiconductor device 100A, 100B, 100C, 100D or 100E illustrated in FIG. 3, 4, 5, 11 or 12.

FIGS. 3, 4, 5, 11 and 12 that respectively illustrate the semiconductor devices 100A, 100B, 100C, 100D and 100E correspond to partial sectional views taken along line C-C' of FIG. 18, but embodiments are not limited to the plan view illustrated in FIG. 18.

In the semiconductor device 100A, 100B, 100C, 100D or 100E illustrated in FIG. 18, reference numeral '300' denotes a chip edge in a case in which the semiconductor device 100A, 100B, 100C, 100D or 100E is embodied as a chip. Referring to FIG. 18, each of the semiconductor devices 100A, 100B, 100C, 100D and 100E includes the anode A, the cathode C, the gate electrode G, a drain/anode bonding pad 302, a source bonding pad 304, a gate bonding pad 306, a cathode bonding pad 308, the drain contact D, and the source contact S.

The drain/anode bonding pad 302 is a portion to which the anode A and the drain contact D are electrically connected. The source bonding pad 304 is a portion to which the source contact S is electrically connected. The gate bonding pad 306 is a portion to which the gate electrode G is electrically connected. The cathode bonding pad 308 is a portion to which the cathode C is electrically connected.

Referring to FIG. 18, the first device D1A, D1B, D1C, or D1D may have a plane shape surrounded by the second contact. For example, the first device D1A, D1B, D1C, or D1D may have a plane shape surrounded by the gate electrode G, which is the second contact. As such, when the first device D1A, D1B, D1C, or D1D is surrounded by the second contact, flow of leakage current into the substrate 110 via an edge 300 may be prevented.

Meanwhile, the beneficial effect of the above-described embodiments may be appreciated if it is assumed that the first device D1 to D1E of the semiconductor devices 100A to 100G according to the above-described embodiments do not include the electric field barrier layer EFB and the first and second nitride semiconductor layers 130 and 140A, 140B, 140C, 140D or 140E, that the first channel layer CH1 instead of the carrier barrier layer CBL is formed at the third heterojunction interface HJ3, and that the anode A and the cathode C thereof are electrically connected to the first channel layer CH1. Under the above assumption, the electron sheet density ns of the first channel layer CH1 may be reduced due to an electric field between the first channel layer CH1 and the substrate 110 as shown in Equation 1.

$$ns = ns_0 - \varepsilon \frac{E}{q} \quad \text{[Equation 1]}$$
$$= ns_0 - \varepsilon \frac{VO}{qt}$$

In Equation 1, $ns_0$ denotes electron sheet density of the 2-DEG layer as the first channel layer CH1 when an electric field is not caused between the first channel layer CH1 and the substrate 110, i.e., when there is no partial depletion in the first channel layer CH1, E denotes an electric field between the first channel layer CH1 and the substrate 110, ϵ denotes permittivity of each of the fourth nitride semiconductor layer 160 and the buffer layer 120, q denotes the charge of electrons, t denotes a distance from the first channel layer CH1 to the substrate 110, and VO denotes an output voltage.

As shown in Equation 1, when the electron sheet density of the 2-DEG layer as the first channel layer CH1 decreases, a resistance RD1 of the first device may increase as shown in Equation 2.

$$R_{D1} = \frac{W1}{ns \times q \times \mu_e \times W_{D1}} \qquad \text{[Equation 2]}$$

$$= \frac{W1}{\left(ns_0 - \varepsilon \frac{VO}{qt}\right) \times q \times \mu_e \times W_{D1}}$$

In Equation 2, with reference to FIG. 3, W1 denotes a distance between the anode A and the cathode C, $\mu_e$ denotes the mobility of electrons, and $W_{D1}$ denotes a total width of the first device. As such, when the resistance RD1 of the first device increases, current-voltage characteristics illustrated in FIG. 2 may be deteriorated as the plot 20.

In the semiconductor devices 100A to 100G according to the embodiments, however, by forming the electric field barrier layer EFB or the seventh nitride semiconductor layer 190, effects of the electric field between the first channel layer CH1 and the substrate 110 on the first channel layer CH1 are prevented and thus, as illustrated in FIG. 10, the first channel layer CH1 may keep the electron sheet density 224 constant. Accordingly, the resistance of the first device does not increase and the current-voltage characteristics of FIG. 2 may remain at the plot 10.

Hereinafter, a method of manufacturing the above-described semiconductor device 100A will be described with reference to FIGS. 19a to 19g and a method of manufacturing the semiconductor device 100C will be described with reference to FIGS. 20a to 20h, but embodiments are not limited thereto. Namely, the semiconductor devices 100A and 100C may be manufactured using methods other than the methods illustrated in FIGS. 19a to 19g and 20a to 20h. In addition, it is obvious that the semiconductor devices 100B, 100D, 100E, 100F and 100G may also be manufactured by modifying the manufacturing methods illustrated in FIGS. 19a to 19g and 20a to 20h by those skilled in the art.

FIGS. 19a to 19g are sectional views sequentially illustrating a method of manufacturing the semiconductor device 100A of FIG. 3.

Referring to FIG. 19a, the buffer layer 120, the fourth nitride semiconductor layer 160, the third and fifth nitride semiconductor layers 150 and 170, the second nitride semiconductor layer 140, and the first nitride semiconductor layer 130 are sequentially stacked on the substrate 110.

The substrate 110 may include a conductive material. For example, the substrate 110 may be a silicon substrate, a silicon carbide substrate, or a GaN substrate, but type of the substrate 110 is not limited to the above-described examples. For example, the substrate 110 may be a silicon substrate having a (111) crystal face as a principal plane and have a thickness of 100 μm to 200 μm.

The buffer layer 120 may include at least one of AlN, GaN, SiC, or AlGaN. When the buffer layer 120 has a threshold thickness or greater, diffusion of silicon atoms from the substrate 110 may be prevented and thus occurrence of melt-back may be prevented. For this operation, the buffer layer 120 may have a thickness of tens to hundreds of nanometers, for example, 100 nm to less than 300 nm. In some embodiments, the buffer layer 120 may be omitted.

The first, second, third, fourth and fifth nitride semiconductor layers 130, 140, 150, 160 and 170 may be formed using a Group III element-containing nitride by, for example, metal organic chemical vapor deposition (MOCVD). In the regard, the third and fifth nitride semiconductor layers 150 and 170 are identical.

Subsequently, referring to FIG. 19b, a mask layer 410 is formed over an entire upper surface of the second nitride semiconductor layer 130, and a photoresist pattern 420 that exposes a region in which the second device D2A is to be disposed is formed on the mask layer 410. In this regard, the mask layer 410 may include SiN. Thereafter, the mask layer 410 is etched by photolithography, e-beam lithography or nano-imprinted lithography using the photoresist pattern 420 as a mask, and the first nitride semiconductor layer 130 is dry-etched by reactive ion etching (RIE) using the etched mask layer 410 and the photoresist pattern 420 as an etching mask to expose a region of the second nitride semiconductor layer 140 in which a contact of the second device D2A is to be disposed.

Next, referring to FIG. 19c, the photoresist pattern 420 is removed, and the gate electrode G is formed on the exposed region of the second nitride semiconductor layer 140.

The gate electrode G may be formed of a metal material. For example, the gate electrode G may include a refractory metal or a mixture thereof. In another embodiment, the gate electrode G may be formed as a single layer or multiple layers including at least one material selected from among Ni, Au, Pt, Ta, TaN, TiN, Pd, W, and $WSi_2$. For example, the gate electrode G may be formed as multiple layers formed of Ni/Au or a single layer formed of Pt.

Next, referring to FIG. 19d, the second nitride semiconductor layer 140 is dry-etched by RIE using the gate electrode G and the mask layer 410 as an etching mask to expose the third and fifth nitride semiconductor layers 150 and 170. In this regard, the second nitride semiconductor layer 140A and the gate layer 148 are identical.

Subsequently, referring to FIG. 19e, the mask layer 410 is removed, and the cathode C of the first device D1A and the source and drain contacts S and D of the second device D2A are simultaneously formed. The cathode C and the source and drain contacts S and D may be formed of the same material. Each of the cathode C and the source and drain contacts S and D may be formed of a metal with ohmic characteristics. In addition, each of the cathode C and the source and drain contacts S and D may include the same material as that of the gate electrode G. In addition, each of the cathode C and the source and drain contacts S and D may be formed of an electrode material having ohmic characteristics. For example, each of the cathode C and the source and drain contacts S and D may be formed as a single layer or multiple layers including at least one of Al, Ti, Cr, Ni, Cu, Au, or Mo. For example, each of the source and drain contacts S and D may be formed as multiple layers formed of Ti/Al or Ti/Mo.

Next, referring to FIG. 19f, the anode A may be formed by lift-off so as to be extended over upper and side surfaces of the first nitride semiconductor layer 130, a side surface of the second nitride semiconductor layer 140A, and an upper surface of the third nitride semiconductor layer 150. The anode A may include a metal material. For example, the anode A may include a refractory metal or a mixture thereof. In another embodiment, the anode A may include at least one material selected from among Pt, Ge, Cu, Cr, Ni, Au, Ti, Al, Ta, TaN, TiN, Pd, W, and $WSi_2$.

Thereafter, referring to FIG. 19g, the connection part CP that connects the anode A and the drain contact D is formed and the metal layer 180 is formed on a rear surface of the substrate 110. The connection part CP and the metal layer 180 may be formed of the same material and include a material with electrical conductivity. For example, each of the connection part CP and the metal layer 180 may be formed as a single layer or multiple layers including at least one of Cr, Ni, Ti, or Au.

FIGS. 20a to 20h are sectional views sequentially illustrating a method of manufacturing the semiconductor device 100C of FIG. 5.

The manufacturing processes illustrated in FIGS. 20a to 20e are the same as those illustrated in FIGS. 19a to 19e and thus a detailed description thereof will be omitted herein.

Referring to FIG. 20f, the opening 142A (e.g., a through-hole) penetrating the first and second nitride semiconductor layers 130 and 140C is formed. For example, the through-hole 142A may be formed by dry-etching the first and second nitride semiconductor layers 130 and 140C.

Subsequently, referring to FIG. 20g, the anode A is formed on both the bottom surface 146 and the side surfaces 144 of the through-hole 142A and the upper surface of the first nitride semiconductor layer 130. The anode A may be formed of a metal material. For example, the anode A may include a refractory metal or a mixture thereof. In another embodiment, the anode A may include at least one of Pt, Ge, Cu, Cr, Ni, Au, Ti, Al, Ta, TaN, TiN, Pd, W, or $WSi_2$.

Next, referring to FIG. 20h, to electrically connect the anode A and the drain contact D, the connection part CP is formed so as to be extended from an upper surface of the anode A via side surfaces of the first and second nitride semiconductor layers 130 and 140C to the drain contact D.

The semiconductor devices according to the above-described embodiments may be applied to various semiconductor circuits such as a DC-to-DC converter, an AC-to-DC converter, an AC-to-AC converter, a DC-to-AC converter, a three-phase circuit motor, a DC stabilizer, and the like.

In addition, the above-described semiconductor circuits may be applied to various devices. For example, the semiconductor circuit of FIG. 17 may be applied to a three-phase induction motor driving device.

Hereinafter, configuration and operations of the three-phase induction motor driving device including the semiconductor circuit according to the above-described embodiment will be described.

FIG. 21 is a block diagram of a three-phase induction motor driving device according to an embodiment. Referring to FIG. 21, the three-phase induction motor driving device includes a three-phase power supply 510, a rectifier unit 520, a DC stabilizer 530, a conversion unit 540, and a three-phase induction motor 550.

The three-phase power supply 510 supplies a three-phase voltage to the rectifier unit 520. The voltage applied to the rectifier unit 520 from the three-phase power supply 510 may for example be 380 V. The rectifier unit 520 rectifies the voltage supplied from the three-phase power supply 510 and the rectified voltage is output to the DC stabilizer 530. For example, the voltage rectified by the rectifier unit 520 may be 630 V.

The DC stabilizer 530 stabilizes the voltage rectified by the rectifier unit 520 by reducing the level of the rectified voltage and outputs the stabilized voltage to the conversion unit 540. In this regard, the DC stabilizer 530 may correspond to the semiconductor circuit of FIG. 17. Operations of the DC stabilizer 530 have already been described above with reference to FIG. 17.

The conversion unit 540 converts the stabilized voltage output from the DC stabilizer 530 into a three-phase AC voltage and outputs the three-phase AC voltage to the three-phase induction motor 550. The three-phase induction motor 550 is driven by the three-phase AC voltage output from the conversion unit 540.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

MODE FOR THE INVENTION

It has already been described in the best mode.

INDUSTRIAL APPLICABILITY

The semiconductor devices according to the above-described embodiments may be applied to various semiconductor circuits such as a DC-to-DC converter, an AC-to-DC converter, an AC-to-AC converter, a DC-to-AC converter, a three-phase circuit motor, a DC stabilizer, and the like, and the semiconductor circuits according to the above-described embodiments may be applied to various devices such as a three-phase induction motor driving device and the like.

The invention claimed is:

1. A semiconductor device, comprising:
   a substrate; and
   a plurality of devices on the substrate,
   wherein a first device of the devices includes:
      a first nitride semiconductor layer on the substrate;
      a second nitride semiconductor layer brought together with the first nitride semiconductor layer to form a first heterojunction interface, between the substrate and the first nitride semiconductor layer;
      a third nitride semiconductor layer brought together with the second nitride semiconductor layer to form a second heterojunction interface, between the substrate and the second nitride semiconductor layer; and
      a first contact portion, at least a part of the first contact portion being configured to be electrically connected to the first and second heterojunction interfaces, and
   wherein a second device of the devices includes:
      a fifth nitride semiconductor layer on the substrate, the third nitride semiconductor layer and the fifth nitride semiconductor layer being identical;
      a sixth nitride semiconductor layer brought together with the fifth nitride semiconductor layer to form a fourth heterojunction interface, between the substrate and the fifth nitride semiconductor layer;
      a second contact portion, at least a part of the second contact portion configured to be connected to the fourth heterojunction interface, the second contact portion including:
         a second gate electrode provided on the fifth nitride semiconductor layer; and
         second drain and source contacts provided with the second gate electrode therebetween and configured to be electrically connected to the fourth heterojunction interface; and
         a gate layer provided between the second gate electrode and the fifth nitride semiconductor layer, the gate layer and the second nitride semiconductor layer being made of an identical material.

2. The semiconductor device according to claim 1, wherein the first device further comprises a fourth nitride semiconductor layer brought together with the third nitride semiconductor layer to form a third heterojunction interface, between the substrate and the third nitride semiconductor layer.

3. The semiconductor device according to claim 1, further comprising a connection part configured to electrically connect the first contact portion to the second contact portion.

4. The semiconductor device according to claim 3, wherein the first contact portion includes a cathode and an anode configured to be respectively connected to opposite sides of the first heterojunction interface, the anode being configured to be electrically connected to the second heterojunction interface.

5. The semiconductor device according to claim 4,
wherein the second drain contact is configured to be electrically connected to the anode via the connection part.

6. The semiconductor device according to claim 5,
wherein the second nitride semiconductor layer includes a ledge part that protrudes towards the second device from a lower portion of the second nitride semiconductor layer to extend the second heterojunction interface towards the second device, and
wherein the anode is provided opposite to the second heterojunction interface, with the ledge part disposed therebetween and configured to be electrically connected to the second heterojunction interface via the connection part.

7. The semiconductor device according to claim 5, wherein at least a portion of the anode, the connection part, or the drain contact is integrally formed.

8. The semiconductor device according to claim 5, wherein the first device has a plane shape surrounded by the second gate electrode.

9. The semiconductor device according to claim 3, wherein the first contact portion includes:
a first gate electrode on the first nitride semiconductor layer;
first drain and source contacts provided with the first gate electrode therebetween and configured to be respectively connected to opposite sides of the first heterojunction interface; and
a hole gas contact configured to electrically connect the first source contact to the connection part and the second heterojunction interface, and
wherein the connection part is configured to connect the hole gas contact to the second contact portion.

10. The semiconductor device according to claim 9,
wherein the connection part is configured to electrically connect the hole gas contact and the second drain contact.

11. A semiconductor circuit, comprising:
the semiconductor device according to claim 3; and
a passive element configured to be connected to the semiconductor device.

12. The semiconductor circuit according to claim 11, wherein the passive element includes:
an inductor having a first terminal configured to be connected to an input voltage and a second terminal configured to be connected to the connection part; and
a capacitor configured to be connected to an output voltage,
wherein the first device is configured to be connected between the second terminal of the inductor and the output voltage, and wherein the second device is configured to be connected between the second terminal of the inductor and a reference potential.

13. The semiconductor device according to claim 1, further comprising a metal layer that faces the first device and the second device on a rear surface of the substrate.

14. The semiconductor device according to claim 1, wherein the first nitride semiconductor layer has a thickness of 5 nm to 40 nm.

15. The semiconductor device according to claim 1, wherein the second nitride semiconductor layer has a thickness of 15 nm to 100 nm.

16. The semiconductor device according to claim 1, wherein the third nitride semiconductor layer has a thickness of 5 nm to 40 nm.

17. The semiconductor device according to claim 1, wherein the gate layer has a thickness of 20 nm to 100 nm.

18. The semiconductor device according to claim 1, wherein the first device has a plane shape surrounded by the second contact portion.

19. A semiconductor device, comprising:
a substrate; and
a plurality of devices on the substrate,
wherein a first device of the devices includes:
a first nitride semiconductor layer on the substrate;
a second nitride semiconductor layer brought together with the first nitride semiconductor layer to form a first heterojunction interface, between the substrate and the first nitride semiconductor layer;
a seventh nitride semiconductor layer provided between the substrate and the second nitride semiconductor layer and doped with a p-type dopant;
a third nitride semiconductor layer provided between the substrate and the seventh nitride semiconductor layer; and
a first contact portion, at least a part of the first contact portion being configured to be electrically connected to the first heterojunction interface and the seventh nitride semiconductor layer,
wherein a second device of the devices includes:
a fifth nitride semiconductor layer on the substrate, the third nitride semiconductor layer and the fifth nitride semiconductor layer being identical;
a sixth nitride semiconductor layer brought together with the fifth nitride semiconductor layer to form a fourth heterojunction interface, between the substrate and the fifth nitride semiconductor layer;
a second contact portion, at least a part of the second contact being configured to be connected to the fourth heterojunction interface, the second contact portion including a gate electrode; and
a gate layer provided between the gate electrode and the fifth nitride semiconductor layer, the gate layer and the seventh nitride semiconductor layer being made of an identical material.

20. The semiconductor device according to claim 19, wherein the first device further includes:
a fourth nitride semiconductor layer brought together with the third nitride semiconductor layer to form a third heterojunction interface, between the substrate and the third nitride semiconductor layer.

21. A semiconductor device, comprising:
a substrate;
a first device provided on the substrate and including:
a first nitride semiconductor layer on the substrate;
a second nitride semiconductor layer brought together with the first nitride semiconductor layer to form a first heterojunction interface, between the substrate and the first nitride semiconductor layer;
a third nitride semiconductor layer brought together with the second nitride semiconductor layer to form a second heterojunction interface, between the substrate and the second nitride semiconductor layer;
a first contact portion configured to be electrically connected to the first and second heterojunction interfaces;
a fourth nitride semiconductor layer brought together with the third nitride semiconductor layer to form a third heterojunction interface, between the substrate and the third nitride semiconductor layer;
a second device provided on the substrate and including:
a fifth nitride semiconductor layer on the substrate;
a sixth nitride semiconductor layer brought together with the fifth nitride semiconductor layer to form a fourth heterojunction interface, between the substrate and the fifth nitride semiconductor layer; and
a second contact portion configured to be connected to the fourth heterojunction interface; and
a connection part configured to electrically connect the first contact portion to the second contact portion,
wherein the first contact portion includes a cathode and an anode configured to be respectively connected to opposite sides of the first heterojunction interface, the anode being configured to be electrically connected to the second heterojunction interface,
wherein the second contact portion includes:
a gate electrode provided on the fifth nitride semiconductor layer; and
a drain contact and a source contact provided with the gate electrode therebetween and configured to be electrically connected to the fourth heterojunction interface, the drain contact being configured to be electrically connected to the anode via the connection part,
wherein the second nitride semiconductor layer includes a ledge part that protrudes towards the second device from a lower portion of the second nitride semiconductor layer to extend the second heterojunction interface towards the second device, and
wherein the anode is provided opposite to the second heterojunction interface, with the ledge part provided therebetween and configured to be electrically connected to the second heterojunction interface via the connection part.

* * * * *